United States Patent
Zheng et al.

(10) Patent No.: US 9,934,857 B2
(45) Date of Patent: Apr. 3, 2018

(54) TERNARY CONTENT ADDRESSABLE MEMORIES HAVING A BIT CELL WITH MEMRISTORS AND SERIALLY CONNECTED MATCH-LINE TRANSISTORS

(71) Applicant: HEWLETT PACKARD ENTERPRISE DEVELOPMENT LP, Houston, TX (US)

(72) Inventors: Le Zheng, Palo Alto, CA (US); Brent Buchanan, Palo Alto, CA (US); John Paul Strachan, Palo Alto, CA (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 0 days.

(21) Appl. No.: 15/228,559

(22) Filed: Aug. 4, 2016

(65) Prior Publication Data

US 2018/0040374 A1     Feb. 8, 2018

(51) Int. Cl.
*G11C 15/00*     (2006.01)
*G11C 15/04*     (2006.01)

(52) U.S. Cl.
CPC .................. *G11C 15/046* (2013.01)

(58) Field of Classification Search
CPC ..................................................... G11C 15/046
USPC ...................... 365/49.17, 49.16, 50; 711/108
See application file for complete search history.

(56) References Cited

U.S. PATENT DOCUMENTS

| | | | | |
|---|---|---|---|---|
| 5,034,919 A | * | 7/1991 | Sasai ...................... | G11C 15/04 365/203 |
| 5,319,590 A | * | 6/1994 | Montoye ................ | G11C 15/04 365/189.07 |
| 5,469,378 A | * | 11/1995 | Albon .................... | G11C 15/04 365/189.05 |
| 5,471,189 A | * | 11/1995 | Dietz .................... | G11C 15/04 340/146.2 |

(Continued)

OTHER PUBLICATIONS

Li-Yue Huang et al., "ReRAM-Based 4T2R Nonvolatile TCAM With 7x NVM-Stress Reduction, and 4x Improvement in Speed-WordLength-Capacity for Normally-Off Instant-On Filter-Based Search Engines Used in Big-Data Processing," 2014 Symposium on VLSI Circuits Digest of Technical Papers, 2014, pp. 1-2, IEEE.

(Continued)

*Primary Examiner* — Vu Le
*Assistant Examiner* — Sung Cho
(74) *Attorney, Agent, or Firm* — Hewlett Packard Enterprise Patent Department

(57) ABSTRACT

An example ternary content addressable memory. A bit cell of the memory may include a first memristor that has a first terminal that is connected to a first data line and a second terminal that is selectively connected to a second data line via a first switching transistor. The bit cell may also include a second memristor that has a first terminal that is connected to a third data line and a second terminal that is selectively connected to a fourth data line via a second switching transistor. The bit cell may also include a first match-line transistor and a second match-line transistor that are con- (Continued)

nected in series between a first rail and a match line, with a gate of the first match-line transistor being connected to the second terminal of the first memristor, and a gate of the second match-line transistor being connected to the second terminal of the second memristor.

17 Claims, 6 Drawing Sheets

(56) References Cited

U.S. PATENT DOCUMENTS

| | | | | |
|---|---|---|---|---|
| 5,479,366 A * | 12/1995 | Sasama | ............... | G11C 15/00 365/189.07 |
| 5,859,791 A * | 1/1999 | Schultz | ............... | G11C 15/04 365/189.05 |
| 6,154,384 A * | 11/2000 | Nataraj | ............... | G11C 15/04 365/168 |
| 6,195,278 B1 * | 2/2001 | Calin | ............... | G11C 15/00 365/189.07 |
| 6,304,477 B1 * | 10/2001 | Naji | ............... | G11C 15/02 365/158 |
| 6,349,049 B1 * | 2/2002 | Schoy | ............... | G11C 15/00 365/203 |
| 6,370,052 B1 * | 4/2002 | Hsu | ............... | G11C 15/04 365/154 |
| 6,389,524 B1 * | 5/2002 | Sato | ............... | G06F 12/04 365/189.07 |
| 6,421,265 B1 * | 7/2002 | Lien | ............... | G11C 15/04 365/189.05 |
| 6,480,406 B1 * | 11/2002 | Jin | ............... | G11C 15/04 365/154 |
| 6,760,241 B1 * | 7/2004 | Gharia | ............... | G11C 15/043 365/189.07 |
| 6,781,857 B1 * | 8/2004 | Lien | ............... | G11C 15/00 365/189.07 |
| 7,002,822 B2 * | 2/2006 | Kang | ............... | G11C 15/04 365/200 |
| 8,023,299 B1 * | 9/2011 | Gharia | ............... | G11C 11/16 365/49.1 |
| 8,130,525 B2 * | 3/2012 | Arsovski | ............... | G11C 15/04 365/49.11 |
| 8,462,532 B1 * | 6/2013 | Argyres | ............... | G11C 15/04 365/154 |
| 8,553,441 B1 * | 10/2013 | Argyres | ............... | G11C 15/04 365/49.1 |
| 8,582,338 B1 * | 11/2013 | Argyres | ............... | G11C 15/04 365/49.1 |
| 8,729,545 B2 * | 5/2014 | Takahashi | ............... | H01L 27/1156 257/43 |
| 9,230,649 B2 | 1/2016 | Chang et al. | | |
| 2003/0081442 A1 * | 5/2003 | Tsuda | ............... | G11C 15/04 365/49.17 |
| 2007/0211535 A1 * | 9/2007 | Kim | ............... | H01L 21/8221 365/185.21 |
| 2009/0310395 A1 * | 12/2009 | Chiang | ............... | G11C 15/04 365/49.17 |
| 2013/0054886 A1 * | 2/2013 | Eshraghian | ............... | G11C 13/0007 711/108 |
| 2014/0071728 A1 * | 3/2014 | Khalili Amiri | ............... | G11C 15/02 365/50 |
| 2014/0153310 A1 * | 6/2014 | Sekar | ............... | G11C 15/00 365/49.15 |
| 2014/0153314 A1 * | 6/2014 | Baker | ............... | G11C 13/0002 365/148 |
| 2014/0185348 A1 * | 7/2014 | Vattikonda | ............... | G11C 15/04 365/49.17 |

OTHER PUBLICATIONS

Nilesh Mishra et al., "4-Transistors of Dynamic Memristor Based TCAM," IJERA, May-Jun. 2012, pp. 2520-2524, vol. 2, Issue 3.

Pilin Junsangsri and Fabrizio Lombardi, "A Memristor-Based TCAM (Ternary Content Addressable Memory) Cell: Design and Evaluation," GLSVLSI'12, May 3-4, 2012, Salt Lake City, Utah, USA, pp. 311-314, ACM.

Syed Shakib Sarwar, "High Performance NVRAM Circuit Design Using Memristor-MOS Hybrid Architecture," May 2014, pp. 1-130, Thesis submitted to Bangladesh University of Engineering and Technology.

* cited by examiner

Fig. 2

| Stored Value | $M_1$ | $M_2$ |
|---|---|---|
| 0 | High | Low |
| 1 | Low | Low |
| X (wildcard) | Any | High |

Fig. 3

| Search Criteria | Stored Value | Result |
|---|---|---|
| 0 | 0 | Match |
| 0 | 1 | *Miss* |
| 0 | X | Match |
| 1 | 0 | *Miss* |
| 1 | 1 | Match |
| 1 | X | Match |
| Y (wildcard) | Any | Match |

Fig. 4

| Operation | WL1 | WL2 | DL1 | DL2 | DL3 | DL4 | RL | ML |
|---|---|---|---|---|---|---|---|---|
| $M_1 \rightarrow$ LRS | $V_{DD}$ | - | $V_{set}$ | GND | - | - | - | - |
| $M_2 \rightarrow$ LRS | - | $V_{DD}$ | - | - | $V_{set}$ | GND | - | - |
| $M_1 \rightarrow$ HRS | $V_{DD}$ | - | GND | $V_{reset}$ | - | - | - | - |
| $M_2 \rightarrow$ HRS | - | $V_{DD}$ | - | - | GND | $V_{reset}$ | - | - |
| Read $M_1$ | $V_{DD}$ | - | GND | $V_{read}$ | - | - | - | - |
| | $V_{DD}$ | - | $V_{read}$ | GND | - | - | - | - |
| Read $M_2$ | - | $V_{DD}$ | - | - | GND | $V_{read}$ | - | - |
| | - | $V_{DD}$ | - | - | $V_{read}$ | GND | - | - |

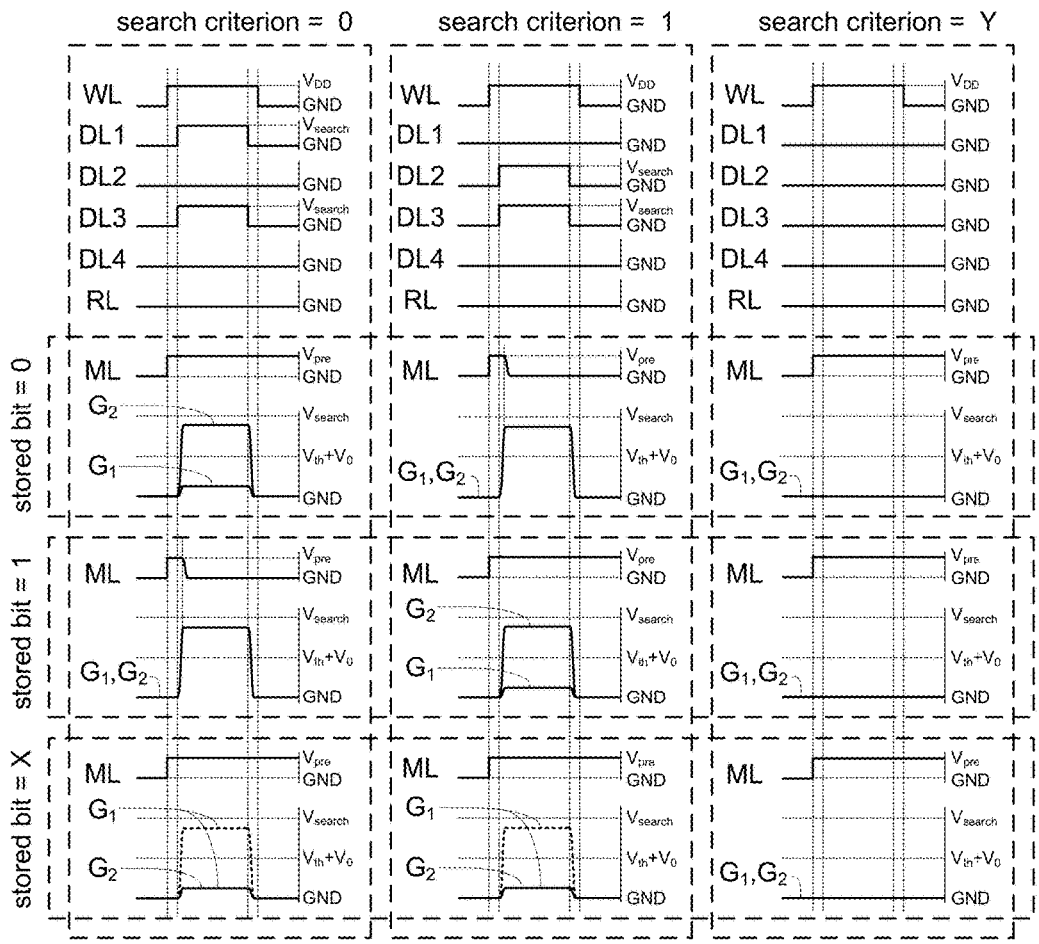

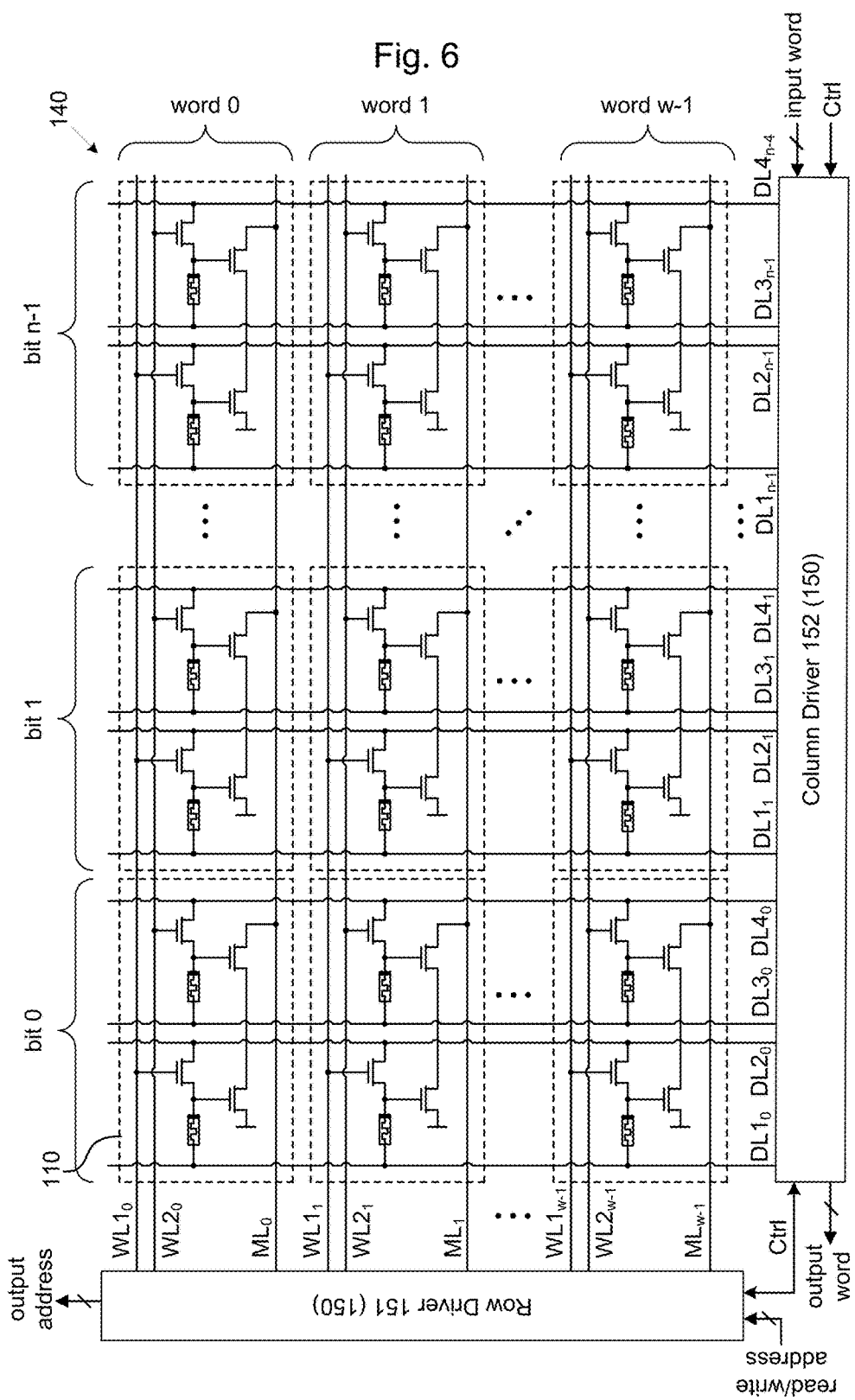

TERNARY CONTENT ADDRESSABLE MEMORIES HAVING A BIT CELL WITH MEMRISTORS AND SERIALLY CONNECTED MATCH-LINE TRANSISTORS

BACKGROUND

Content addressable memory (CAM) is a type of memory that can perform a search operation in which a data string may be input as search content and the resulting output is an address of a location in the memory that stores matching data (if there is any). This is in contrast to a read operation in which an address is input and the resulting output is the data stored in the memory location corresponding to the searched address. Certain CAMs may be able to perform both the aforementioned search operation and the aforementioned read operation, while non-CAM memories may be able to perform the read operation but not the search operation.

Ternary content addressable memory (TCAM) is a type of CAM in which the bit cells can store a wildcard data value in addition to two binary data values. When a bit cell that stores the wildcard value is searched, the result is a match regardless of what search criterion is used to search the bit cell. Certain TCAMs may also allow a search to be conducted on the basis of a wildcard search criterion. When a bit cell is searched based on the wildcard search criterion, the result is a match regardless of what value is stored in the bit cell.

BRIEF DESCRIPTION OF THE DRAWINGS

FIG. 2 is a table illustrating an association between resistance states and stored values.

FIG. 3 is a table illustrating search results for combinations of search criteria and stored value.

FIG. 4 is a table illustrating voltages that are applied to wiring lines of an example TCAM to perform writing and reading operations.

FIG. 5A is a table illustrating voltages that are applied to wiring lines of an example TCAM to perform search operations.

FIG. 5B is a signal diagram illustrating voltages that are applied to wiring lines of an example TCAM to perform search operations, as well as the states of an example bit cell resulting from such search operations for each combination of search criterion and stored value.

FIG. 6 is a diagram illustrating an example TCAM with an array of multiple bit cells.

DETAILED DESCRIPTION

Figure 1A:
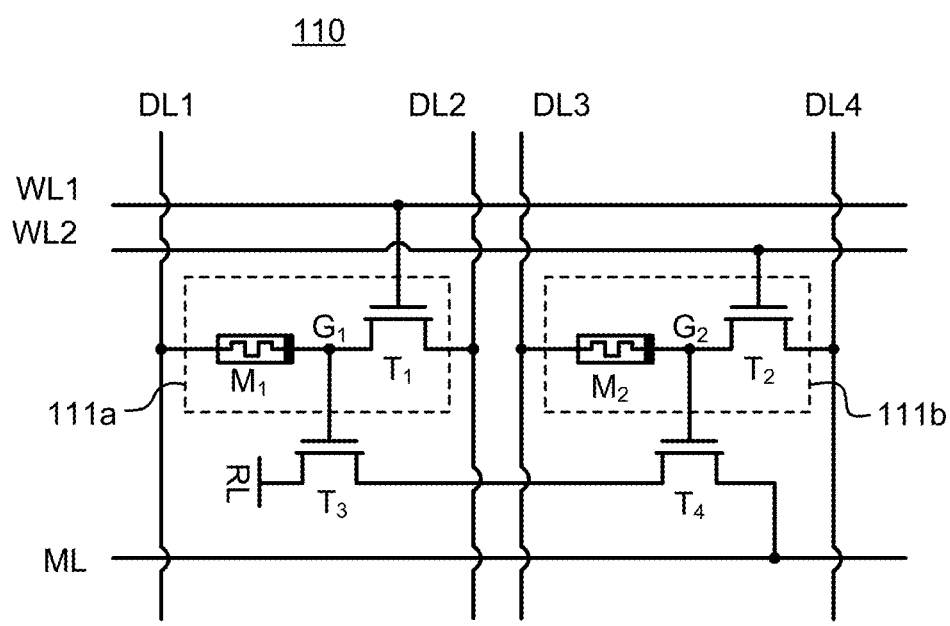
FIG. 1A is circuit diagram illustrating an example bit cell of an example TCAM.

Described herein are example TCAMs that include memristors as storage elements. Also described herein are example devices that may have a TCAM as a component thereof, as well as example methods of operating TCAMs.
[Example TCAMs—Overview]

The example TCAMs described herein may include memristors as storage elements. The use of memristors as storage elements, as opposed to using, for example, SRAMs or DRAMs, allows the example TCAMs disclosed herein to be non-volatile memory devices. In addition, as a result of using memristor-based storage elements, the example TCAMs disclosed herein may have higher storage densities and lower power consumption than comparable TCAMs that use SRAMs or DRAMs as storage elements.

The example TCAMs disclosed herein may be capable of storing three values including a wildcard value. Certain of the example TCAMs disclosed herein may also be capable of being searched on the basis of three search criteria including a wildcard search criterion. Thus, the example TCAMs disclosed herein may provide greater flexibility and speed in search operations as compared to CAMs that store just two values or CAMs/TCAMs that are searchable on the basis of just two search criteria.

Furthermore, the example TCAMs disclosed herein may have bit cell circuit layouts that can fit in a smaller layout space than other TCAM bit cell layouts, which may allow the example TCAMs to have a more densely packed memory array (i.e., more bit cells per unit area) than other comparable TCAMs. In certain examples, such savings of bit cell layout space might be achieved, for example, as a result of the bit cell circuit layout allowing for the use of just four FETs per bit cell instead of the five or more FETs per bit cell that may be required in other circuit layouts in order to provide TCAM functionality. As another example of how such savings of bit cell layout space might be achieved, in certain of the example TCAMs disclosed herein all of the transistors in the bit cells of the TCAM may be a same channel type as one another (for example, all NFETs); this may allow for a well to be omitted from the bit cell array that might otherwise be needed, thus freeing up layout space that would have been used for the well. In addition to saving layout space, the use of transistors having all the same channel type may also decrease the complexity and/or cost of manufacturing the TCAM.

In particular, in certain example TCAMs disclosed herein, a bit cell may include two memristors, two switching transistors, and two match-line transistors. A first memristor and first switching transistor may be connected in series between a first data line and a second data line, while the second memristor and the second switching transistor may be connected in series between a third data line and a fourth data line. The match-line transistors may be connected in series between a rail and a match line. A gate of one of the match-line transistors may be connected to a common node of the first memristor and the first switching transistor, while a gate of the other one of the match-line transistors may be connected to a common node of the second memristor and the second switching transistor.

The bit cell may store three values by changing resistance states of the two memristors. A first combination of resistance states of the two memristors may correspond to a 0 value, a second combination of resistance states may correspond to a 1 value, and a third combination of resistance states may corresponds to an X (wildcard) value.

Furthermore, certain of the example TCAMs may also include control circuitry that searches the bit cell based on a first search criterion (e.g., 0), based on a second search criterion (e.g., 1), and based on a wildcard search criterion. If the bit cell stores a value that does not match the search criterion, the respective voltages of both common nodes during the search may become an ON-voltage such that both of the match-line transistors are turned on; this results in the match line being connected to the rail, which causes a voltage of the match line (which has been pre-charged) to be pulled down to the voltage of the rail. If the bit cell stores a value that matches the search criterion, then the voltage of at least one of the common nodes may become an OFF-voltage such that at least one of the match-line transistors remains off; this results in the voltage of the match-line not being pulled down (at least not by that bit cell—it might be pulled down by some other bit cell). Thus, matches or misses of the search criterion may be determined by monitoring the match line and determining whether or not its voltage is pulled low.

The control circuitry may search the bit cell based on the first search criterion by pre-charging the match line, applying a first voltage to the first data line and to the third data line, and applying a ground voltage to the second data line and to the fourth data line. The control circuitry may search the bit cell based on a second search criterion by pre-charging the match line, applying the ground voltage to the first data line and to the fourth data line, and applying the first voltage to the second data line and to the third data line. The control circuitry may search the bit cell based on the wildcard search criterion by applying a ground voltage to both the first and second data lines and/or by applying a ground voltage to both the third and fourth data lines.

The switching transistors may be sized such that their respective channel resistances when on are between a resistance associated with a low resistance state of the memristors and a resistance associated with a high resistance state of the memristors. Thus, the first memristor and the first switching transistor may form a first resistive divider, and the second memristor and the second switching transistor may form a second resistive divider. The common node between the first memristor and the first switching transistor corresponds to the output terminal of the first resistive divider, and thus an output voltage of the first resistive divider controls the conductive state the match-line transistor whose gate is connected thereto (the first match-line transistor). The common node between the second memristor and the second switching transistor corresponds to the output terminal of the second resistive divider, and thus an output voltage of the second resistive divider controls the conductive state of the match-line transistor whose gate is connected thereto (the second match-line transistor).

The resistance states of the memristors and the voltages that are applied to the resistive dividers during a search operation are established such that a resistance state of the second memristor determines, regardless of a resistance state of the first memristor, whether a wildcard value is stored in the bit cell. Moreover, when a wildcard value is not stored in the bit cell, a resistance state of the first memristor determines whether a first binary value or a second binary value is stored in the bit cell. In particular, when a wildcard value is stored in the bit cell, the output voltage of the second resistive divider is always an OFF-voltage, and therefore the second match line transistor remains off; in this state, it does not matter whether the first match line transistor is on or off, since if either one of the match line transistors is off then the match line is disconnected from the rail. On the other hand, when a non-wildcard value is stored in the bit cell, the output voltage of the second resistive divider is always an ON-voltage, and therefore the second match line transistor is on; in this state, whether or not the match line is connected to the rail depends on whether or not the first match-line transistor is on or off, which in turn depends on the resistance state of the first memristor and whether it indicates a match or a miss for the search criterion.

Certain example TCAMs may include multiple instances of the example bit cells described above, which may be arrayed in rows and columns. In certain examples, each first and second data line may correspond to a column and may be connected to each bit cell in their corresponding column, and each word line may correspond to a row and be connected to each bit cell in their corresponding row. Each match line may correspond to a row and be connected to multiple bit cells that are in their corresponding row, with the number of bit cells per match line being equal to a search unit size for the TCAM (i.e., a word size) and the bit cells that are connected to the same match line as one another forming a word storage block. The bit cells of the word storage block may be searched to see if the data stored therein matches an input search word. The match line for a given word storage block may be pulled low if any one of the bit cells thereof misses its respective search criterion, and therefore it can be determined whether the given word storage block stores data that matches the search word by monitoring whether the corresponding match line is pulled low. Each row may include a single word storage block (in which case there may be one word line per row), or each row may include P>1 word storage blocks (in which case there may be P word lines per row).

[Bit Cells—Detailed Examples]

FIG. 1A illustrates an example bit cell 110 of an example TCAM 100. The example bit cell 110 may include a first memristor $M_1$, a second memristor $M_2$, a first switching transistor $T_1$, a second switching transistor $T_2$, a first match-line transistor $T_3$, and a second match-line transistor $T_4$. The first memristor $M_1$ and the first switching transistor $T_1$ may be connected in series between a first data line DL1 and a second data line DL2. The second memristor $M_2$ and the second switching transistor $T_2$ may be connected in series between a third data line DL3 and a fourth data line DL4. Thus, the first memristor $M_1$ may be switchably connected to the second data line DL2 via the first switching transistor $T_1$, and the second memristor $M_2$ may be switchably connected to the fourth data line DL4 via the second switching transistor $T_2$. The first memristor $M_1$ and the first switching transistor $T_1$ may be connected to each other via the node $G_1$, and the second memristor $M_2$ and the second switching transistor $T_2$ may be connected to each other via the node $G_2$. The first match-line transistor $T_3$ and the second match-line transistor $T_4$ may be connected in series between a rail RL and a match line ML.

In certain examples, gates of the first and second switching transistors $T_1$ and $T_2$ may be connected to word lines WL1 and WL2, respectively, and therefore voltages of the word lines WL1 and WL2 may control conductive states of the first and second switching transistors $T_1$ and $T_2$. In certain other examples, a single word line WL may be connected to the gates of both the first and second switching transistors $T_1$ and $T_2$. Having separate word lines WL1 and WL2 may allow the first and second switching transistors $T_1$ and $T_2$ to be individually controllable, while having a single word line WL may save layout space.

One of the respective gates of the first and second match-line transistors $T_3$ and $T_4$ may be connected to one of the nodes $G_1$ and $G_2$, while the other one of the respective gates of the first and second match-line transistors $T_3$ and $T_4$ may be connected to the other one of the nodes $G_1$ and $G_2$. Which gate is connected to which node is not particularly important, so long as one gate is connected to one node and the other gate is connected to the other node. For example, in FIG. 1, the gate of the first match-line transistor $T_3$ is connected to the node $G_1$ and the gate of the second match-line transistor $T_4$ is connected to the node $G_2$. In this example, the voltage of the node $G_1$ may control a conductive state of the first match-line transistor $T_3$, while the voltage of the node $G_2$ may control a conductive state of the second match-line transistor $T_4$.

The first and second memristors $M_1$ and $M_2$ may serve as the storage element of the bit cell 110. A memristor (such as the first and second memristors $M_1$ and $M_2$) may be a device whose resistance can be changed between multiple resistance states by applying certain voltage differences across it or flowing certain currents through it, with the device "remembering" or maintaining its most recent resistance state even when the voltage/current that caused it to enter that state has been removed. In other words, the current resistance state of a memristor may depend on the magnitude and polarity of voltage differences that have been applied across it in the past or on how much electric charge has flowed in what direction through it in the past.

In particular, the memristors $M_1$ and $M_2$ may each be capable of changing between a low resistance state in which it exhibits relatively low resistance and a high resistance state in which it exhibits relatively high resistance. For each of the memristors $M_1$ and $M_2$, the respective memristor may be caused to enter the low resistance state by applying a setting voltage difference of sufficient magnitude across the memristor with a certain polarity, and the respective memristor may be caused to change to the high resistance state by applying a resetting voltage difference of sufficient magnitude across the memristor with an opposite polarity.

The polarities with which the setting/resetting voltage differences may be applied to the memristors $M_1$ and $M_2$ in order to perform setting and resetting are indicated in FIG. 1 by a black band on one end of the symbol for the memristor. In particular, in order to set the memristor $M_1$ or $M_2$ to the low resistance state, the setting voltage difference should be applied across the memristor $M_1$ or $M_2$ such that a lower voltage is applied to the end of the memristor $M_1$ or $M_2$ that has the black band than is applied to the other end of the memristor $M_1$ or $M_2$. Specifically, in the configuration illustrated in FIG. 1 the larger voltage is applied to the left side of the memristor $M_1$ or $M_2$ in order to set the memristor $M_1$ or $M_2$. Conversely, in order to reset the memristor $M_1$ or $M_2$ to the high resistance state, the resetting voltage difference should be applied across the memristor $M_1$ or $M_2$ such that the larger voltage is applied to the end of the memristor $M_1$ or $M_2$ that has the black band. Specifically, in the configuration illustrated in FIG. 1 the larger voltage is applied to the right side of the memristor $M_1$ or $M_2$ in order to reset the memristor $M_1$ or $M_2$.

Once the memristor $M_1$ or $M_2$ is set or reset, it will tend to stay in its current resistance state until it is reset or set again. Moreover, the first and second memristors $M_1$ and $M_2$ in the example bit cell 110 may be set or reset independently from one another. The combination of resistance states of the first and second memristors $M_1$ and $M_2$ may be used to store data values. For example, resistance states and stored values may be associated with one another as illustrated in the table of FIG. 2. Specifically, a first digital value (such as 0) may be stored by resetting the first memristor $M_1$ to the high resistance state and setting the second memristor $M_2$ to the low resistance state; a second digital value (such as 1) may be stored by setting the first memristor $M_1$ to the low resistance state and setting the second memristor $M_2$ to the low resistance state; and a wildcard value may be stored by resetting the second memristor $M_2$ to the high resistance state (regardless of the resistance state of the first memristor $M_1$).

[Example Write and Read Operations—Individual Bit Cell]

The first and second memristors $M_1$ and $M_2$ may be set or reset by applying voltages to the various wiring lines as illustrated in FIG. 4. In the table illustrated in FIG. 4, rows correspond to operations and columns correspond to wiring lines, with each cell specifying a voltage that is to be applied to the corresponding wiring line during performance of the corresponding operation. When a given operation has more than one row associated therewith (see, for example, the operation "Read $M_1$"), each of the rows indicates an alternative way to perform the operation. Note that the absence of multiple rows for a particular operation does not necessarily mean that there are no alternative ways to perform the operation.

In the table illustrated in FIG. 4, a dash ("-") indicates that the voltage of the corresponding wiring line does not affect the performance of the corresponding operation, and therefore the voltage of such a wiring line during the operation may be set based on other considerations. For example, if multiple operations are being performed simultaneously, a wiring line whose voltage is not specified as part of one operation (indicated by a dash in the table) may have its voltage specified as part of the other operation being performed. In particular, it may be possible for two operations to be performed simultaneously if they do not specify different voltages to be applied to the same wiring line at the same time. For example, the operation of setting $M_1$ to the low resistance state ("$M_1 \rightarrow LRS$") and the operation of setting $M_2$ to the low resistance state ("$M_2 \rightarrow LRS$") could be performed simultaneously without conflict, since $M_1 \rightarrow LRS$ specifies voltages for WL1, DL1, and DL2 and $M_2 \rightarrow LRS$ specifies voltage for WL2, DL3, and DL4. In some examples, if no operations that are currently being performed specify a voltage for a particular wiring line, then the wiring line may be floated. Floating certain wiring lines whose voltage is not specified during an operation may be advantageous in certain contexts because it may prevent current from flowing through certain circuit components, and may also reduce power usage. In some examples, if no operations that are currently being performed specify a voltage for a particular wiring line, then the ground voltage GND may be applied to that wiring line. Applying GND to certain wiring lines whose voltage is not specified during an operation may be advantageous in certain contexts because it may hold certain circuit components that are not being used in the operation in an OFF state.

As illustrated in FIG. 4, the first memristor $M_1$ may be set to the low resistance state by turning on the first switching transistor $T_1$ (e.g., applying $V_{DD}$ to the word line WL1), applying a setting voltage $V_{set}$ to the first data line DL1, and applying a ground voltage GND to the second data line DL2. This causes the setting voltage difference to be applied across the memristor $M_1$ with a first polarity (i.e., left-to-right), as $V_{set}$ is applied to a left side of the memristor $M_1$ and a lower voltage is applied to the right side of the memristor $M_1$ via the transistor $T_1$.

Similarly, the second memristor $M_2$ may be set to the low resistance state by turning on the second switching transistor $T_2$ (e.g., apply $V_{DD}$ to the word line WL2), applying the setting voltage $V_{set}$ to the third data line DL3, and applying the ground voltage GND to the fourth data line DL4. This causes the setting voltage difference to be applied across the memristor $M_2$ with the first polarity (i.e., left-to-right), as $V_{set}$ is applied to the left side of the memristor $M_2$ and a lower voltage is applied to the right side of the memristor $M_2$ via the transistor $T_2$.

The first memristor $M_1$ may be reset to the high resistance state by turning on the first switching transistor $T_1$, applying the ground voltage GND to the first data line DL1, and applying a resetting voltage $V_{reset}$ to the second data line DL2. This causes the resetting voltage difference to be applied across the memristor $M_1$ with a second polarity (i.e., right-to-left), as $V_{reset}$ is applied to the right side of the memristor $M_1$ via the first transistor $T_1$ and a lower voltage is applied to the left side of the memristor $M_1$.

The second memristor $M_2$ may be reset to the high resistance state by turning on the second switching transistor $T_2$, applying the ground voltage GND to the third data line DL3, and applying to the resetting voltage $V_{reset}$ to the fourth data line DL4. This causes the resetting voltage difference to be applied across the memristor $M_2$ with the second polarity (i.e., right-to-left), as $V_{reset}$ is applied to the right side of the memristor $M_1$ via the second transistor $T_2$ and a lower voltage is applied to the left side of the memristor $M_2$.

As illustrated in FIG. 4, while setting or resetting the first memristor $M_1$, any voltages may be applied to the data lines DL3 and DL4 without affecting the first memristor $M_1$. Similarly, in setting or resetting the second memristor $M_2$, any voltages may be applied to the data lines DL1 and DL2 without affecting the second memristor $M_2$. Thus, for example, the first and second memristor $M_1$ and $M_2$ could both be set simultaneously or could both be reset simultaneously. As another example, the first memristor $M_1$ could be set at the same time that the second memristor $M_2$ is reset. As another example, the first memristor $M_1$ could be reset at the same time that the second memristor $M_2$ is set.

It should be understood that, in practice, the voltages that actually appear on the nodes $G_1$ and $G_2$ during the setting and resetting operations will differ slightly from the voltages $V_{set}$, $V_{reset}$, and GND that are carried on the data lines DL1-DL4 during these operations, due to the fact that the transistors $T_1$, and $T_2$ have finite resistances when turned on ($R_{T1}$ and $R_{T2}$). In particular, the voltage appearing on the node $G_1$ may be equal to $$\frac{V_{set}}{1 + \frac{R_{M1}}{R_{T1}}}$$

during a setting operation and $$\frac{V_{reset}}{1 + \frac{R_{T1}}{R_{M1}}}$$

during a resetting operation. Similarly, the voltage appearing on the node $G_2$ may be equal to $$\frac{V_{set}}{1 + \frac{R_{M2}}{R_{T2}}}$$

during a setting operation and $$\frac{V_{reset}}{1 + \frac{R_{T2}}{R_{M2}}}$$

during a resetting operation. Note that $R_{M1}$ and $R_{M2}$ may vary throughout the setting/resetting operation, and therefore the voltage appearing on the node $G_1$ or the node $G_2$ may vary throughout the setting/resetting operation.

The magnitudes of $V_{set}$ and $V_{reset}$ may be set to any values that are large enough to result in setting and resetting, respectively, the memristors $M_1$ or $M_2$. In particular, if $V_{set\_min}$ is the minimum voltage difference that will result in setting the memristor $M_1$ or $M_2$ and $V_{reset\_min}$ is the minimum voltage difference that will result in resetting the memristor $M_1$ or $M_2$, then $V_{set}$ may be greater than $V_{set\_min}$ and $V_{reset}$ may be greater than $V_{reset\_min}$. More specifically, because the first and second switching transistors $T_1$ and $T_2$ have non-negligible channel resistances when on, the voltages $V_{set}$ and $V_{reset}$ may be set so as to satisfy the following system of equations:

$$V_{set} \geq \frac{R_{HRS} + R_{T1}}{R_{HRS}} V_{set\_min} \qquad \text{(eq. 1)}$$

$$V_{set} \geq \frac{R_{HRS} + R_{T2}}{R_{HRS}} V_{set\_min}$$

$$V_{reset} \geq \frac{R_{T1} + R_{LRS}}{R_{LRS}} V_{reset\_min}$$

$$V_{reset} \geq \frac{R_{T2} + R_{LRS}}{R_{LRS}} V_{reset\_min}$$

where $R_{LRS}$ is a resistance associated with a low resistance state of the memristors $M_1$ and $M_2$, $R_{HRS}$ is a resistances associated with a high resistances state of the memristors $M_1$ and $M_2$, $R_{T1}$ is the channel resistance of the first switching transistor $T_1$, and $R_{T2}$ is the channel resistance of the second switching transistor $T_2$. $V_{set}$ and $V_{reset}$ do not necessarily need to have the same magnitude, since $V_{set\_min}$ is not necessarily the same as $V_{reset\_min}$. However, $V_{set}$ and $V_{reset}$ could be set to the same value as long as that value satisfies equation 1. In certain examples, $V_{DD}=V_{set}=V_{reset}$, where $V_{DD}$ is a highest voltage level of the TCAM. The values of $V_{set\_min}$ and $V_{reset\_min}$ may be parameters of the memristor $M_1$ or $M_2$ that are known in advance, that are determined theoretically based on a model of the memristor $M_1$ or $M_2$, or that are determined experimentally.

The value that is stored in the bit cell 110 may be determined by determining the respective resistance states of both the first and second memristors $M_1$ and $M_2$ and determining which value is associated with the combination of resistance states according to a predetermined association rule, such as the rule illustrated in FIG. 2. The process of determining the resistance state of one of the first and second memristors $M_1$ and $M_2$ may be referred to individually as reading the memristor $M_1$ or $M_2$, while the collection of processes that result in the determination of the value stored in the bit cell 110 may be referred to collectively as a "read operation" for the bit cell 110.

The first memristor $M_1$ may be read by applying a read voltage difference across the first memristor $M_1$ (with any polarity) and measuring a current that flows through the first memristor $M_1$. The current that flows through the memristor $M_1$ may be sensed via the first data line DL1 or via the second data line DL2. Then, the magnitude of the current that flows through the memristor $M_1$ may be used to determine the resistance state of the memristor $M_1$ (e.g., a high resistance state will result in low current, while a low resistance state will result in high current). For example, the first switching transistor $T_1$ may be turned on, the ground voltage GND may be applied to the first data line DL1 and a read voltage $V_{read}$ may be applied to the second data line DL2. This causes the read voltage difference to be applied across the memristor $M_1$ with the second polarity (i.e., right-to-left), and hence current flows from the second data line DL2 to the first data line DL1, passing through the first memristor $M_1$.

Similarly, the second memristor $M_2$ may be read by applying the read voltage difference across the second memristor $M_2$ (with any polarity) and measuring a current that flows through the second memristor $M_2$. The current that flows through the memristor $M_2$ may be sensed via the third data line DL3 or the fourth data line DL4. Then, the magnitude of the current that flows through the memristor $M_2$ may be used to determine the resistance state of the memristor $M_2$ (e.g., a high resistance state will result in low current, while a low resistance state will result in high current). For example, the second switching transistor $T_2$ may be turned on, the ground voltage GND may be applied to the third data line DL3, and the read voltage $V_{read}$ may be applied to the fourth data line DL4. This causes the read voltage difference to be applied across the memristor $M_2$ with the second polarity (i.e., right-to-left), and hence current flows from the fourth data line DL4 to the third data line DL3, passing through the second memristor $M_2$.

As illustrated in FIG. 4, while reading the first memristor $M_1$, any voltages may be applied to the data lines DL3 and DL4 without affecting the first memristor $M_1$. Similarly, while reading the second memristor $M_2$, any voltages may be applied to the data lines DL1 and DL2 without affecting the second memristor $M_2$. Thus, for example, the first and second memristor $M_1$ and $M_2$ could both be read simultaneously.

In general, applying voltage differences across the memristor $M_1$ or $M_2$ whose magnitudes are relatively small in comparison to the setting/resetting voltage differences will not significantly affect the resistance state of the memristor $M_1$ or $M_2$. Thus, the read voltage difference $V_{read}$ may be set to a value that is small enough not to change a resistance state of the memristor $M_1$ or $M_2$ during a read operation. For example, $V_{read}$ may be set to a value that is less than $V_{set\_min}$ and less than $V_{reset\_min}$. In certain examples in which the memristors $M_1$ and $M_2$ are unipolar memristors, voltage differences that are applied across the memristor with a particular polarity do not disturb a resistance state of the memristor $M_1$ or $M_2$ regardless of their magnitude; thus, in such an example, a value of $V_{read}$ need not be restricted if applied with the particular polarity that does not disturb the resistance state.

[Example Search Operations—Individual Bit Cell]

The example bit cell 110 may be searched based on three search criteria—namely 0, 1, and a wildcard (denoted Y herein for convenience). The configuration of the bit cell 110 and the voltages that are applied to the bit cell during a search operation are set such that search operations produce the search results illustrated in FIG. 3. In particular, when the bit cell 110 is searched based on the 0 search criterion, the result is a match if the bit cell 110 stores a 0, a miss if the bit cell 110 stores a 1, and a match if the bit cell stores an X. When the bit cell 110 is searched based on the 1 search criterion, the result is a miss if the bit cell 110 stores a 0, a match if the bit cell 110 stores a 1, and a match if the bit cell stores an X. When the bit cell 110 is searched based on the wildcard search criterion (Y), the result is a match regardless of what value is stored by the bit cell 110. A match is indicated when both the first and the second match-line transistors $T_3$ and $T_4$ are turned on, thereby pulling down a voltage of the match line ML (which was previously pre-charged). A match is indicated when at least one of the first and second match-line transistors $T_3$ and $T_4$ is kept off, thereby leaving the match line at its pre-charged voltage.

During a search operation, the conductive state of the first match-line transistor $T_3$ is controlled by the voltage of the node $G_1$ and the conductive state of the second match-line transistor $T_4$ is controlled by the voltage of the node $G_2$. Thus, in order to achieve the search results described above, the voltages of both the nodes $G_1$ and $G_2$ during a search operation should be an ON-voltage when the bit cell 110 stores a value that is a miss and the voltage of at least one of the nodes $G_1$ and $G_2$ should be an OFF-voltage when the bit cell 110 stores a value that is a match. When a gate-source voltage of the first match-line transistor $T_3$ is greater than a threshold voltage thereof ($V_{th3}$), the first match-line transistor $T_3$ is turned on, and when a gate-source voltage of the first match-line transistor $T_3$ is less than $V_{th3}$, the first match-line transistor $T_3$ is turned off. Thus, an ON-voltage for the first match-line transistor $T_3$ is any voltage that is greater than $V_{th3}+V_0$ and on OFF-voltage for the first match-line transistor $T_3$ is any voltage that is less than $V_{th3}+V_0$, where $V_0$ is the voltage applied to the rail RL during a search operation.

Similarly, when a gate-source voltage of the second match-line transistor $T_4$ is greater than a threshold voltage thereof ($V_{th4}$), the second match-line transistor $T_4$ is turned on, and when a gate-source voltage of the second match-line transistor $T_4$ is less than $V_{th4}$, the second match-line transistor $T_4$ is turned off. Thus, an ON-voltage for the second match-line transistor $T_4$ is any voltage that is greater than $V_{th4}+V_0$ and on OFF-voltage for the second match-line transistor $T_4$ is any voltage that is less than $V_{th4}+V_0$. In certain examples, $V_{th3}=V_{th4}$, but this does not necessarily have to be the case.

FIGS. 5A and 5B illustrate search operations for the example bit cell 110 that result in voltages appearing on the nodes $G_1$ and $G_2$ that achieve the above-described search results. In particular, at the start of a search operation the match line ML may be pre-charged to a pre-charge voltage $V_{pre}$, and then voltages may be applied to the various data lines based on the search criterion as follows. To search the bit cell 110 based on the 0 search criterion, the first and second switching transistors $T_1$ and $T_2$ may be turned on by applying $V_{DD}$ to the word lines WL1 and WL2, a search voltage $V_{search}$ may be applied to the first data line DL1 and to the third data line DL3, the ground voltage GND may be applied to the second data line DL2 and the fourth data line DL4, and the voltage $V_0$ may be applied to the rail RL. To search the bit cell 110 based on the 1 search criterion, the first and second switching transistors $T_1$ and $T_2$ may be turned on by applying $V_{DD}$ to the word lines WL1 and WL2, the search voltage $V_{search}$ may be applied to the second data line DL2 and to the third data line DL3, the ground voltage GND may be applied to the first data line DL1 and to the fourth data line DL4, and the voltage $V_0$ may be applied to the rail RL. To search the bit cell 110 based on the wildcard (Y) search criterion, the first switching transistor $T_1$ may be turned on by applying $V_{DD}$ to the word line WL1, and the ground voltage GND may be applied to both the first and second data lines DL1 and DL2. As an alternative, to search the bit cell 110 based on the wildcard (Y) search criterion, the second switching transistor $T_1$ may be turned on by applying $V_{DD}$ to the word line WL2, and the ground voltage GND may be applied to both the third and fourth data lines DL3 and DL4.

When the resistance states of the first and second memristors $M_1$ and $M_2$, the channel resistances of the first and second switching transistors $T_1$ and $T_2$, the threshold voltages $V_{th3}$ and $V_{th4}$ of the first and second match-line transistors $T_3$ and $T_4$, and the voltages described above are appropriately set, the search operations described above will result in voltages appearing on the nodes $G_1$ and $G_2$ that achieve the above-described search results. The reasons for this, as well as criteria for setting these parameters appropriately, are explained in greater detail below.

Figure 1B:
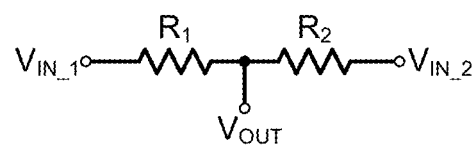
FIG. 1B is a circuit diagram illustrating an example resistive divider.

The voltage of the node $G_1$ during a searching operation may be modeled by considering the first memristor $M_1$ and the first switching transistor $T_1$ as being resistors of a first resistive divider 111a. Similarly, the voltage of the node $G_2$ during a searching operation may be modeled by considering the second memristor $M_2$ and the second switching transistor $T_2$ as being resistors of a second resistive divider 111b. In general, a resistive divider is formed when two resistors are connected in series, input voltages are applied to opposite input terminals of the resistors, and an output voltage is taken from a common node between the resistors. In particular, FIG. 1B illustrates a generalized form of a resistive divider, with resistors $R_1$ and $R_2$ being connected in series, input voltages $V_{IN\_1}$ and $V_{IN\_2}$ being applied to the input terminals, and the output voltage $V_{OUT}$ being taken from the common node between the resistors $R_1$ and $R_2$ (which is the output terminal of the resistive divider). The output voltage $V_{OUT}$ of the generalized resistive divider from FIG. 1B may be given by the following, in which $R_1$ and $R_2$ are the resistances of the resistors $R_1$ and $R_2$, respectively:

$$V_{OUT} = \frac{R_2 V_{IN\_1} + R_1 V_{IN\_2}}{R_1 + R_2} \qquad \text{(eq. 2)}$$

In a certain sense, a memristor is not the same type of circuit component as a resistor, as the memristor can have its resistance changed over time while a resistor generally has a constant resistance. However, during periods of time in which voltage differences that are less than the setting or resetting voltage differences are applied across the memristor, the memristor has an approximately constant resistance, and thus the memristors $M_1$ and $M_2$ may be modeled approximately during these periods as resistors. In addition, in the example bit cell 110, the first and second switching transistors $T_1$ and $T_2$ may be sized such that they have non-negligible channel resistances when they are on (i.e., ohmic). In particular, the first switching transistor $T_1$ and the second switching transistor $T_2$ may be sized such that their respective channel resistances when on ($R_{T1}$ and $R_{T2}$) are greater than a resistance associated with a low resistance state of the memristors $M_1$ and $M_2$ ($R_{LRS}$), but less than a resistance associated with a high resistance state of the memristors $M_1$ and $M_2$ ($R_{HRS}$)—that is, $R_{LRS} < R_{T1} < R_{HRS}$ and $R_{LRS} < R_{T2} < R_{HRS}$. In certain examples, $R_{T1} = R_{T2}$. The particular values that are set for the channel resistances $R_{T1}$ and $R_{T2}$ may be determined based on considerations described in greater detail below with regard to searching operations.

The input terminals of the first resistive divider 111a are the left-side terminal of the first memristor $M_1$ that is connected to the first data line DL1 and the right-side terminal of the first switching transistor $T_1$ that is connected to the second data line DL2. Thus, the input voltages that are supplied to the first resistive divider 111a are the voltage carried by the first data line DL1 ($V_{DL1}$) and the voltage carried by the second data line ($V_{DL2}$) (corresponding, respectively, to the input voltages $V_{IN\_1}$ and $V_{IN\_2}$ of the generalized resistive divider). The output terminal of the first resistive divider 111a is the node $G_1$, and the output voltage of the first resistive divider 111a is the voltage of the node $G_1$ ($V_{G1}$) (corresponding to the output voltage $V_{OUT}$ of the generalized resistive divider). Thus, from equation 2, the voltage of the node $G_1$ may be modeled by the following:

$$V_{G1} = \frac{R_{T1} V_{DL1} + R_{M1} V_{DL2}}{R_{M1} + R_{T1}} \qquad \text{(eq. 3)}$$

where $R_{M1}$ is the present resistance of the first memristor $M_1$.

Similarly, the input terminals of the second resistive divider 111b are the left-side terminal of the second memristor $M_2$ that is connected to the third data line DL3 and the right-side terminal of the second switching transistor $T_2$ that is connected to the fourth data line DL4. Thus, the input voltages that are supplied to the second resistive divider 111b are the voltage carried by the third data line DL3 ($V_{DL3}$) and the voltage carried by the fourth data line ($V_{DL4}$) (corresponding, respectively, to the input voltages $V_{IN\_1}$ and $V_{IN\_2}$ of the generalized resistive divider). The output terminal of the second resistive divider 111b is the node $G_2$, and the output voltage of the second resistive divider 111b is the voltage of the node $G_2$ ($V_{G2}$) (corresponding to the output voltage $V_{OUT}$ of the generalized resistive divider). Thus, from equation 2, the voltage of the node $G_2$ may be modeled by the following:

$$V_{G2} = \frac{R_{T2} V_{DL3} + R_{M2} V_{DL4}}{R_{M2} + R_{T2}} \qquad \text{(eq. 4)}$$

where $R_{M2}$ is the present resistance of the second memristor $M_2$.

If the search operation is based on the Y search criterion, GND is applied to the input terminals of at least one of the first and second resistive dividers 111a and 111b (hereinafter, the "selected resistive divider"). This causes the voltage of the output terminal of the selected resistive divider 111a/111b to become GND (see equation 3 or 4), regardless of the resistance state of its corresponding memristor $M_1/M_2$. As a result, the one of the match-line transistors $T_3$ or $T_4$ whose gate is connected to the output terminal of the selected resistive divider 111a/111b will be kept off during a search operation based on the Y search criterion, regardless of which data value is stored in the bit cell 110. Thus, the bit cell 110 indicates a match when searched based on the Y search criterion regardless of the data value stored in the bit cell 110, which corresponds to the desired search results illustrated in FIG. 3.

It does not matter which one of the resistive dividers 111a or 111b is selected to have GND applied to its input terminals during the search operation based on the Y search criterion. Moreover, any voltages may be applied to the other one of the resistive dividers 111a or 111b during a search operation based on the Y search criterion without affecting the search results. In particular, since the one of the match-line transistors $T_3$ or $T_4$ that is associated with the selected resistive divider 111a or 111b is kept off during such a search, it is irrelevant whether or not the other one of the match-line transistor $T_3$ or $T_4$ is on or off. In certain examples, during a search based on the Y search criterion, GND may be applied to the input terminals of both resistive dividers 111a and 111b (i.e., GND may be applied to the first through fourth data lines DL1-DL4), such as in the example illustrated in FIG. 5B.

In contrast to the search based on the Y search criterion, if the search is based on the 0 or 1 search criterion, then whether or not a match/miss is indicated will depend on the data value that is stored in the bit cell. During a search operation based on the 0 search criterion, the input voltages of the first resistive divider 111a become $V_{DL1}=V_{search}$ and $V_{DL2}=$GND and the input voltage of the second resistive divider 111b become $V_{DL3}=V_{search}$ and $V_{DL4}=$GND. Thus, from equations 3 and 4 the voltages of the nodes $G_1$ and $G_2$ during a search based on the 0 search criterion (denoted herein by $V_{G1}|^{S=0}$ and $V_{G1}|^{S=0}$) become:

$$V_{G1}|^{S=0} = \frac{R_{T1}}{R_{M1}+R_{T1}}V_{search} \quad \text{(eq. 5)}$$

$$V_{G2}|^{S=0} = \frac{R_{T2}}{R_{M2}+R_{T2}}V_{search}$$

During a search operation based on the 1 search criterion, the input voltages of the first resistive divider 111a become $V_{DL1}=$GND and $V_{DL2}=V_{search}$ and the input voltages of the second resistive divider 111b become $V_{DL3}=V_{search}$ and $V_{DL4}=$GND. Thus, from equations 3 and 4 the voltages of the nodes $G_1$ and $G_2$ during a search based on the 1 search criterion (denoted herein by $V_{G1}|^{S=1}$ and $V_{G2}|^{S=1}$) become:

$$V_{G1}|^{S=1} = \frac{R_{M1}}{R_{M1}+R_{T1}}V_{search} \quad \text{(eq. 6)}$$

$$V_{G2}|^{S=1} = V_{G2}|^{S=0} = \frac{R_{T2}}{R_{M2}+R_{T2}}V_{search}$$

The resistance values $R_{M1}$ and $R_{M2}$ in equations 5 and 6 vary depending on the data value that is stored in the bit cell 100 (see FIG. 2), and therefore the voltages of the nodes $G_1$ and $G_2$ during searches based on the 0 or 1 search criteria (i.e., the voltages $V_{G1}|^{S=0}$, $V_{G1}|^{S=1}$, and $V_{G2}|^{S=0}=V_{G2}|^{S=1}$) may vary depending on which data value is stored in the bit cell 100. In particular, the voltages of the nodes $G_1$ and $G_2$ may be determined for each stored value (i.e., for each combination of resistances states) by substituting $R_{LRS}$ and $R_{HRS}$ for $R_{M1}$ and/or $R_{M2}$ in equations 5 and 6. Note that $R_{LRS}$ and $R_{HRS}$ are resistance values that are associated with the low and high resistances states, respectively, of the memristors $M_1$ and $M_2$, but that the resistance of the memristor $M_1$ or $M_2$ is not necessarily exactly $R_{LRS}$ or exactly $R_{HRS}$ whenever the memristor $M_1$ or $M_2$ is in the low resistance state of the high resistance state, respectively. Instead, $R_{LRS}$ and $R_{HRS}$ may be thought of as model values for the resistances of the memristors $M_1$ and $M_2$. This is indicated in the following equations by use of the "≈" symbol.

The voltages of the nodes $G_1$ and $G_2$ during search operations based on the 0 and 1 search criteria will be described below in the following order. First, the case in which the bit cell stores an X (wildcard) value and is searched based on either the 0 or 1 search criterion will be described. Second, the state of the node $G_2$ in the case in which the bit cell 110 stores a 0 or 1 value and is searched based on the 0 or 1 search criterion will be described. Third, the states of the node $G_1$ in cases in which the bit cell 110 stores a 0 or 1 value and is searched based on the 0 or 1 search criterion will be described.

If the stored value is X (wildcard) and the search criterion is either 0 or 1, then using equation 6 with $R_{M2}≈R_{HRS}$, the voltage of the node $G_2$ in these states (denoted herein by $V_{G2}|_{D=X}^{S=0}$ or $V_{G2}|_{D=X}^{S=1}$) becomes:

$$V_{G2}|_{D=X}^{S=0} = V_{G2}|_{D=X}^{S=1} = \frac{R_{T2}}{R_{HRS}+R_{T2}}V_{search} \quad \text{(eq. 7)}$$

Because $R_{HRS}>R_{T2}$, the voltage $V_{G2}|_{D=X}^{S=0}=V_{G2}|_{D=X}^{S=1}$ is a relatively low voltage, as illustrated in FIG. 5B. As can be seen from equation 7, the larger $R_{HRS}$ is as compared to $R_{T2}$, the smaller the voltage $V_{G2}|_{D=X}^{S=0}=V_{G2}|_{D=X}^{S=1}$ will be, and the voltage $V_{G2}|_{D=X}^{S=0}=V_{G2}|_{D=X}^{S=1}$ will always be less than $$\frac{1}{2}V_{search}.$$

For example, if $R_{HRS}=4·R_{T2}$, then $$V_{G2}|_{D=X}^{S=0} = V_{G2}|_{D=X}^{S=1} = \frac{1}{5}V_{search}.$$

Thus, because $V_{G2}|_{D=X}^{S=0}=V_{G2}|_{D=X}^{S=1}$ is a low value, the second match-line transistor $T_4$, whose gate is connected to the node $G_2$, is turned off by this voltage. More specifically, by appropriately setting $V_{search}$, $V_0$, $R_{HRS}$, $R_{T2}$, and $V_{th4}$, it can be ensured that the gate-source voltage of the second match-line transistor $T_4$ during these searches is less than $V_{th4}$.

Thus, the second match line transistor $T_4$ is turned off whenever the bit cell 110 stores an X and is searched based on a 0 or 1 search criterion. Therefore the bit cell 110 does not connect the match line ML to the rail RL whenever the bit cell stores an X and is searched based on a 0 or 1 search criterion, regardless of the conductive state of the first match-line transistor $T_3$. Thus, a match is indicated whenever the bit cell 110 stores an X and is searched based on a 0 or 1 search criterion. This reflects the fact that the resistance state of the second memristor $M_2$ determines whether or not an X is stored in the bit cell 110 independently of the resistance state of the first memristor $M_1$. Thus, the voltage of the node $G_1$ when the bit cell 110 stores an X is not described in detail herein, since the voltage of the node $G_1$ does not affect whether or not a match is indicated in this case.

If the stored value is 0 or 1 and the search criterion is either 0 or 1, then, using equation 6 with $R_{M2}≈R_{LRS}$, the voltage of the node $G_2$ in these states (denoted herein by $V_{G2}|_{D=0}^{S=0}$, $V_{G2}|_{D=1}^{S=0}$, $V_{G2}|_{D=0}^{S=1}$, and $V_{G2}|_{D=1}^{S=1}$) becomes:

$$V_{G2}|_{D=0}^{S=0} = V_{G2}|_{D=1}^{S=0} = V_{G2}|_{D=0}^{S=1} = V_{G2}|_{D=1}^{S=1} ≈ \frac{R_{T2}}{R_{LRS}+R_{T2}}V_{search} \quad \text{(eq. 8)}$$

Because $R_{LRS}<R_{T2}$, the voltage $V_{G2}|_{D=0}^{S=0}=V_{G2}|_{D=1}^{S=0}=V_{G2}|_{D=0}^{S=1}=V_{G2}|_{D=1}^{S=1}$ is a relatively high voltage, as illustrated in FIG. 5B. As can be seen from equation 8, the larger $R_{T2}$ is as compared to $R_{LRS}$, the larger the voltage $V_{G2}|_{D=0}^{S=0}=V_{G2}|_{D=1}^{S=0}=V_{G2}|_{D=0}^{S=1}=V_{G2}|_{D=1}^{S=1}$ will be, and the voltage $V_{G2}|_{D=0}^{S=0}=V_{G2}|_{D=1}^{S=0}=V_{G2}|_{D=0}^{S=1}=V_{G2}|_{D=1}^{S=1}$ will always be greater than $$\frac{1}{2}V_{search}.$$

For example, if $R_{T2}=4 \cdot R_{LRS}$, then $$V_{G2}|_{D=0}^{S=0} = V_{G2}|_{D=1}^{S=0} = V_{G2}|_{D=0}^{S=1} = V_{G2}|_{D=1}^{S=1} = \frac{4}{5}V_{search}.$$

Thus, because $V_{G2}|_{D=0}^{S=0}=V_{G2}|_{D=1}^{S=0}=V_{G2}|_{D=0}^{S=1}=V_{G2}|_{D=1}^{S=1}$ is a high value, the second match-line transistor $T_4$, whose gate is connected to the node $G_2$, is turned on by this voltage. More specifically, by appropriately setting $V_{search}$, $V_0$, $R_{LRS}$, $R_{T2}$, and $V_{th4}$, it can be ensured that the gate-source voltage of the second match-line transistor $T_4$ during these searches is greater than $V_{th4}$.

Thus, the second match-line transistor $T_4$ is turned on whenever the bit cell stores 0 or 1 and is searched based on a 0 or 1 search criterion. Therefore, the conductive state of the first match-line transistor $T_3$ during these searches will determine whether or not the match line ML is connected to the rail RL. The conductive state of the first match-line transistor $T_3$ is controlled by the voltage of the node $G_1$ which depends on the resistance state of the first memristor $M_1$, and therefore when the bit cell 110 stores 0 or 1 and is searched based on 0 or 1 search criteria, the state of the first the memristor $M_1$ controls whether or not there is a match. The voltages of the node $G_1$ in these searches are described below.

From the above it can be seen that, during a search based on the 0 or 1 search criteria, the voltage of the node $G_2$ is high whenever the bit cell stores an X and low whenever the bit cell 110 does not store an X. This reflects the fact that the resistance state of the second memristor $M_2$ determines whether or not an X is stored independently of the resistance state of the first memristor $M_1$, and that the resistance state of the first memristor $M_1$ determines whether a 0 or a 1 is stored in the bit cell 110 when an X is not stored in the bit cell 110.

If the search criterion is 0 and the bit cell 110 stores a 0, then, using equation 5 with $R_{M1} \approx R_{HRS}$, the voltage of the node $G_1$ in this state (denoted herein by $V_{G1}|_{D=0}^{S=0}$) becomes:

$$V_{G1}\Big|_{D=0}^{S=0} \approx \frac{R_{T1}}{R_{HRS}+R_{T1}}V_{search} \qquad \text{(eq. 9)}$$

If the search criterion is 0 and the bit cell 110 stores a 1, then, using equation 5 with $R_{M1} \approx R_{LRS}$, the voltage of the node $G_1$ in this state (denoted herein by $V_{G1}|_{D=1}^{S=0}$) becomes:

$$V_{G1}\Big|_{D=1}^{S=0} \approx \frac{R_{T1}}{R_{LRS}+R_{T1}}V_{search} \qquad \text{(eq. 10)}$$

If the search criterion is 1 and the bit cell stores a 0, then using equation 6 with $R_{M1} \approx R_{HRS}$, the voltage of the node $G_1$ in this state (denoted herein by $V_{G1}|_{D=0}^{S=1}$) becomes:

$$V_{G1}\Big|_{D=0}^{S=1} \approx \frac{R_{HRS}}{R_{HRS}+R_{T1}}V_{search} \qquad \text{(eq. 11)}$$

If the search criterion is 1 and the bit cell 110 stores a 1, then, using equation 6 with $R_{M1} \approx R_{LRS}$, the voltage of the node $G_1$ in this state (denoted herein by $V_{G1}|_{D=1}^{S=1}$) becomes:

$$V_{G1}\Big|_{D=1}^{S=1} \approx \frac{R_{LRS}}{R_{LRS}+R_{T1}}V_{search} \qquad \text{(eq. 12)}$$

Equations 9 and 12 correspond to combinations of search operations and stored data values that are matches. Because $R_{LRS}<R_{T1}<R_{HRS}$, both the voltages $V_{G1}|_{D=0}^{S=0}$ and $V_{G1}|_{D=1}^{S=1}$ are relatively low voltages, as illustrated in FIG. 5B. As can be seen from equation 9, the larger $R_{HRS}$ is as compared to $R_{T1}$, the smaller the voltage $V_{G1}|_{D=0}^{S=0}$ will be. Similarly, as can be seen from equation 12, the larger $R_{T1}$ is as compared to $R_{LRS}$, the smaller the voltage $V_{G1}|_{D=1}^{S=1}$ will be. The voltages $V_{G1}|_{D=0}^{S=0}$ and $V_{G2}|_{D=1}^{S=1}$ will both always be less than $\frac{1}{2}V_{search}$, since $R_{LRS}<R_{T1}<R_{HRS}$. For example, if $R_{HRS}=4 \cdot R_{T2}$ and $R_{T2}=4 \cdot R_{LRS}$ then $$V_{G1}\Big|_{D=0}^{S=0} = V_{G1}\Big|_{D=1}^{S=1} = \frac{1}{5}V_{search}.$$

because the voltages $V_{G1}|_{D=0}^{S=0}$ and $V_{G1}|_{D=1}^{S=1}$ are low values, the first match-line transistor $T_3$ is turned off during these searches. Thus, a match is indicated. More specifically, by appropriately setting $V_{search}$, $V_0$, $R_{HRS}$, $R_{LRS}$, $R_{T1}$, and $V_{th3}$, it can be ensured that the gate-source voltage of the first match-line transistor $T_3$ during these searches is less than the threshold voltage $V_{th3}$.

Equations 10 and 11 correspond to combinations of search operations and stored data values that are misses. Because $R_{LRS}<R_{T1}<R_{HRS}$, both the voltages $V_{G1}|_{D=1}^{S=0}$ and $V_{G1}|_{D=0}^{S=1}$ are relatively high voltages, as illustrated in FIG. 5B. As can be seen from equation 10, the larger $R_{T1}$ is as compared to $R_{LRS}$, the larger the voltage $V_{G1}|_{D=1}^{S=0}$ will be. Similarly, as can be seen from equation 11, the larger $R_{HRS}$ is as compared to $R_{T1}$, the larger the voltage $V_{G1}|_{D=0}^{S=1}$ will be. The voltages $V_{G1}|_{D=1}^{S=0}$ and $V_{G1}|_{D=0}^{S=1}$ will both always be greater than $$\frac{1}{2}V_{search},$$

since $R_{LRS}<R_{T1}<R_{HRS}$. For example, if $R_{HRS}=4 \cdot R_{T2}$ and $R_{T2}=4 \cdot R_{LRS}$ then $$V_{G1}\Big|_{D=1}^{S=0} = V_{G1}\Big|_{D=0}^{S=1} = \frac{4}{5}V_{search}.$$

Because the voltages $V_{G1}|_{D=1}^{S=0}$ and $V_{G1}|_{D=0}^{S=1}$ are high values, the first match-line transistor $T_3$ is turned on during these searches. Because the second match-line transistor $T_4$ is also turned on during these searches (see description above), the match line ML is connected to the rail RL and a miss is indicated. More specifically, by appropriately setting $V_{search}$, $V_0$, $R_{HRS}$, $R_{LRS}$, $R_{T1}$, and $V_{th3}$, it can be ensured that the gate-source voltage of the first match-line transistor $T_3$ during these searches is greater than the threshold voltage $V_{th3}$.

Thus, based on the forgoing considerations, appropriate values for the voltages $V_{search}$ and $V_0$, the resistances $R_{HRS}$, $R_{LRS}$, $R_{T1}$, and $R_{T2}$, and the threshold voltages $V_{th3}$ and $V_{th4}$ may be established according to the following criteria in order to ensure the search results illustrated in FIG. 3 are achieved:

$$V_0 + V_{th1} > \frac{R_{T1}}{R_{HRS} + R_{T1}} V_{search} \qquad \text{(eq. 13)}$$

$$V_0 + V_{th1} > \frac{R_{LRS}}{R_{LRS} + R_{T1}} V_{search}$$

$$V_0 + V_{th1} < \frac{R_{T1}}{R_{LRS} + R_{T1}} V_{search}$$

$$V_0 + V_{th1} < \frac{R_{HRS}}{R_{HRS} + R_{T1}} V_{search}$$

$$V_0 + V_{th2} < \frac{R_{T2}}{R_{LRS} + R_{T2}} V_{search}$$

$$V_0 + V_{th2} > \frac{R_{T2}}{R_{HRS} + R_{T2}} V_{search}$$

In addition to the constraints of equation 13, the value of $V_{search}$ may also be established so as to avoid inadvertently setting or resetting one of the memristors $M_1$ or $M_2$ during a searching operation. To avoid these phenomenon, $V_{search}$ may be established such that:

$$V_{search} < \frac{R_{HRS} + R_{T1}}{R_{HRS}} V_{set\_min}; \qquad \text{(eq. 14)}$$

$$V_{search} < \frac{R_{T1} + R_{LRS}}{R_{LRS}} V_{reset\_min};$$

$$V_{search} < \frac{R_{HRS} + R_{T2}}{R_{HRS}} V_{set\_min}; \text{ and}$$

$$V_{search} < \frac{R_{T2} + R_{LRS}}{R_{LRS}} V_{reset\_min}$$

In certain examples, $V_{search}$ may be the same value as $V_{read}$.

[TCAMs—Detailed Examples]

An example TCAM may include an array of multiple bit cells 110. The bit cells 110 may be arrayed in rows and columns. The TCAM may include multiple word lines WL (one per word storage block), multiple match lines ML (one per word storage block), multiple first data lines DL1 (one per column), multiple second data lines DL2 (one per column), multiple third data lines DL3 (one per column), multiple fourth data lines DL4 (one per column), and a rail RL.

The bit cells 110 may be grouped into word storage blocks, where all of the bit cells 110 that are part of the same word storage block are in the same row as one another and are connected to the same match line ML as one another. The bit cells 110 that are part of the same word storage block may also be connected to the same word line WL as one another. The word storage blocks may each have the same number of bit cells 110 as the number of bits per word, where a word is a data unit used by the example TCAM 100 for writing, reading, and/or searching. In certain examples, each row of the array may include one word storage block (see the example illustrated in FIG. 6), while in other examples each row of the array may include multiple word storage blocks. If there are multiple word storage blocks per row, then there may be multiple match lines ML per row, as each word storage block has a corresponding match line ML. If there are multiple word storage blocks per row and if each word storage block has its own word line WL, then there may be multiple match lines ML per row.

Because all of the bit cells 110 in a given word storage block are connected to the same match line ML as one another, during a search operation the match line ML of a given word storage block may be pulled low if any one of its bit cells 110 stores a value that is a miss to a corresponding bit of a input search word (even if all of the other bit cells 110 in the word storage block are a match). Thus, it can be easily determined whether a word storage block stores a word that matches an input search word by monitoring whether its corresponding match line is pulled low.

In examples in which all of the bit cells 110 in a given word storage block are connected to the same word line WL as one another, all of the bit cells 110 in the given word storage block may be selected at the same time by turning on the word line WL that corresponds to the given word storage block.

Each bit cell 110 in a given column may be connected to the same first through fourth data lines DL1-DL4 as one another. Thus, each bit cell 110 in a same column may be searched simultaneously based on the same search criterion.

Each bit cell 110 in the array may be connected to the same rail RL as one another, where the rail RL may be a collection of one or more wirings that carry the same voltage as one another.

FIG. 6 illustrates an example TCAM 100 in which an array 140 of bit cells 110 has W rows and N columns, with one word storage block per row. Hence, the example TCAM 100 may include word lines $WL_0$ though $WL_{W-1}$, match lines $ML_0$ though $ML_{W-1}$, first data lines $DL1_0$ though $DL1_{N-1}$, second data lines $DL2_0$ though $DL2_{N-1}$, third data lines $DL3_0$ though $DL3_{N-1}$, fourth data lines $DL4_0$ though $DL4_{N-1}$, and a rail RL.

Because there is one word storage block per row in the example TCAM 100, there are W word storage blocks in the TCAM 100, i.e., word 0 through word W−1, and a word size in the example TCAM 100 is N bits. Thus, each column corresponds to a specific bit position, i.e., bit 0 through bit N−1. The data value stored in a given bit cell 110 corresponds to a specific bit of a word that is stored in the word storage block that includes the give bit cell 110, with the position of the bit within the stored word being determined by the bit position of the column in which the bit cells 110 is disposed.

The TCAM 100 may include control circuitry 150 that applies signals to the various wiring lines mentioned above so as to control operations of the bit cells 110, such as read, write, and search operations. The control circuitry 150 may comprise drivers, shift registers, decoders, and the like that are connected to the various wiring lines of the array 140. The control circuitry 150 may receive a control signal Ctrl that instructs the control circuitry 150 which operation it should perform. The control circuitry 150 may also receive a read/write address that indicates a target word storage block for a read operation or a write operation. The control circuitry 150 may output an output word as a result of performing a read operation, with the output word corresponding to the word that is stored in the word storage block whose address corresponds to the read/write address. The control circuitry 150 may also receive an input word that indicates either a word that the TCAM 100 is to be searched for during a search operation or a word that is to be written to a particular word storage block during a write operation. The control circuitry 150 may also output an output address as a result of performing a search operation, with the output address corresponding to the address (or addresses) of any word storage block(s) whose stored word matches the input search word.

In FIG. 6, the control circuitry 150 is illustrated as including a row driver 151 and a column driver 152. The row driver 151 may include one or more drivers, shift registers, decoders, and the like that are connected to and drive wiring lines that correspond to rows of the array 140. The column driver 152 may include one or more drivers, shift registers, decoders, and the like that are connected to and drive wiring lines that correspond to columns of the array 140.

In particular, the row driver 151 may be connected to the word lines $WL_0$ though $WL_{W-1}$ and the match lines $ML_0$ though $ML_{W-1}$, and may supply electrical signals to and/or sense electrical signals carried on these wiring lines. For example, the row driver 151 may include decoders and drivers that are to select one of the word storage blocks by applying $V_{DD}$ to one of the word lines WL based on an input read/write address during a read or write operation, and that is to apply $V_{DD}$ to all of the word lines WL during a search operation. As another example, the row driver 151 may include decoders and drivers that are to, during a search operation, pre-charge all of the match lines ML, sense which match lines ML do or do not have their voltage pulled low, and output addresses of any word storage blocks whose match lines ML were not pulled low.

The column driver 152 may be connected to the first data lines $DL1_0$ though $DL1_{N-1}$, second data lines $DL2_0$ though $DL2_{N-1}$, third data lines $DL3_0$ though $DL3_{N-1}$, and fourth data lines $DL4_0$ though $DL4_{N-1}$, and may supply electrical signals to and/or sense electrical signals carried on these wiring lines. For example, the column driver 152 may include decoders and drivers that are to selectively apply $V_{set}$, $V_{reset}$, or GND variously to the first through fourth data lines DL1-DL4 based on an input word during a writing operation, apply $V_{read}$ or GND variously to the first through fourth data lines DL1-DL4 during a read operation, and selectively apply $V_{search}$ or GND variously to the first through fourth data lines DL1-DL4 based on an input search word during a search operation.

The rail RL may be connected to a driver that applies $V_0$ thereto during a searching operation. This driver(s) may be part of, for example, the row driver 151 or the column driver 152. In certain examples, the values of the various resistances, threshold voltages, and $V_{search}$ may be established such that the voltage $V_0$ may be set equal to the ground voltage GND (see equation 13).

It should be understood that separate drivers could be provided to drive different types of wiring lines (e.g., one driver drives the first data lines DL1 and a separate driver drives the second data lines DL2), or that a single driver could be provided to drive multiple different types of wiring lines (e.g., a single driver drives both the first data lines DL1 and the second data lines DL2). Furthermore, it should be understood that the various components of the control circuitry 150 could be physically located on any side or combination of sides of the array 140, and that the relative locations illustrated in FIG. 6 are not intended to imply physical locations of the components in a physical device that instantiates the example TCAM 100.

[Example Read/Write Operations—TCAM]

When the control signal Ctrl instructs the control circuitry 150 that a read operation or a write operation is to be performed, the row driver 151 may select a target word storage block based on the input read/write address by applying $V_{DD}$ to its corresponding word line WL, and the column driver 152 may then proceed to apply voltages to the column wiring lines according to the table in FIG. 4 to perform the read/write operations for each bit cell 110 in the selected word storage block in the manner described above with respect to reading a single bit cell 110.

During a read operation, all of the memristors $M_1$ and $M_2$ in the target word storage block may be simultaneously read, or the first memristors $M_1$ and the second memristors $M_2$ may be read sequentially (the order does not matter), with the reading operation for each individual memristor being performed in the manner described above with respect to reading operations for single bit cells 110. For example, to read all of the memristors $M_1$ and $M_2$ of the target word storage block simultaneously, the corresponding word line WL (or word lines WL1/WL2 if there are more than one word line per word bit cell 110) may be selected, GND may be applied to all of the first data lines $DL1_0$ though $DL1_{N-1}$ and all of the third data lines $DL3_0$ though $DL3_{N-1}$, and $V_{read}$ may be applied to all of the second data lines $DL2_0$ through $DL2_{N-1}$ and fourth data lines $DL4_0$ through $DL4_{N-1}$. In this state, the column driver 152 may sense the currents flowing through the first memristors $M_1$ of the target word storage block via the first data lines $DL1_0$ though $DL1_{N-1}$ or via the second data lines $DL2_0$ though $DL2_{N-1}$, and may sense the currents flowing through the second memristors $M_2$ of the target word storage block via the third data lines $DL3_0$ though $DL3_{N-1}$ of via the fourth data lines $DL4_0$ through $DL4_{N-1}$. The column driver 152 may determine the resistances states of the memristors $M_1$ and $M_2$ of each bit cell 110 of the selected word based on the respective currents flowing through the memristors, and a data value stored in each bit cell 110 of the target word storage block may be determined based on the combination of resistance states of the memristors $M_1$ and $M_2$ of the bit cell 110 (see FIG. 2). The respective data values stored in the N bit cells 110 of the target words storage block may then be combined based on the respective bit positions of the bit cells 110 into an N-bit output word (e.g., a data value of the bit-k position bit cell 110 is output as the $k^{th}$ bit of the output word, for k={0, 1, . . . N−1}).

During a write operation, the column driver 152 may determine, for each of the N bit cells 110 in the target word storage block, whether the particular bit cell 110 should store 0, 1, or X (wildcard) based on a bit-position of the particular bit cell 110 and an N-bit input word (e.g., the bit-k position bit cell 110 is to store the $k^{th}$ bit of the input word, for k={0, 1, . . . N−1}). The column driver 152 may then variously set or reset the memristors $M_1$ and/or $M_2$ of the target word storage block based on the respective data values that the bit cells 110 are to store. For example, those ones of the first data lines $DL1_0$ though $DL1_{N-1}$ whose corresponding bit cell 110 is to store 1 may have $V_{set}$ applied thereto, and those ones the first data lines $DL1_0$ though $DL1_{N-1}$ whose corresponding bit cell 110 is to store 0 may have GND applied thereto. Those ones of the second data lines $DL2_0$ though $DL2_{N-1}$ whose corresponding bit cell 110 is to store 1 may have GND applied thereto, and those ones the second data lines $DL2_0$ though $DL2_{N-1}$ whose corresponding bit cell 110 is to store 0 may have $V_{reset}$ applied thereto. Those ones of the third data lines $DL3_0$ though $DL3_{N-1}$ whose corresponding bit cell 110 is to store 1 or a 0 may have $V_{set}$ applied thereto, and those ones of the third data lines $DL3_0$ though $DL3_{N-1}$ whose corresponding bit cell 110 is to store X may have GND applied thereto. Those ones of the fourth data lines $DL4_0$ through $DL4_{N-1}$ whose corresponding bit cell 110 is to store 1 or a 0 may have GND applied thereto, and those ones of the fourth data lines $DL4_0$ through $DL4_{N-1}$ whose corresponding bit cell 110 is to store X may have $V_{reset}$ applied thereto. The above-described voltages may be applied by the column driver 152 to the various data lines DL1-DL4 while the target word storage block is being selected by the row driver 151 (i.e., while $V_{DD}$ is being applied to the word line WL, or word lines WL1/WL2, that correspond(s) to the target word storage block).

In certain examples, the write operation may be completed in a single stage by variously setting or resetting each memristor $M_1$ or $M_2$ in the target word storage block at the same time. This may be possible because, in certain examples, the memristors $M_1$ and $M_2$ of a given bit cell 110 do not share any of the same data lines, and thus it may be possible for a setting/resetting operation for the first memristor $M_1$ in a given bit cell 110 to be performed at the same time that a setting/resetting operation is performed for the second memristor $M_2$ of the given bit cell 110. This may be beneficial in certain applications because it may, for example, allow for the writing operation to be completed more quickly and with less power usage.

In certain examples the writing operation may be performed in multiple stages. For example, all of the memristors $M_1$ and $M_2$ in the target word storage block may first be placed in the same resistance state (i.e., all may be set or all are reset), and then specific memristors $M_1$ and/or $M_2$ in the target word storage block may be changed to a different resistance state in order to cause each of the bit cells 110 in the target word storage block to store its appropriate value. As another example, all of the first memristors $M_1$ in the target word storage block may first be set/reset, and then all of the second memristors $M_2$ in the target words storage block may be set/reset.

Although the reading and writing operations were described above as being performed in units of words, it should be understood that writing could be performed in other units. For example, any number of bit cells 110 could be written to or read from without necessarily writing to or reading the other bit cells 110 in the same word storage block. In such an example, the word line WL of the word storage block that contains the target bit cell(s) 110 could be selected, the ground voltage GND could be applied to each one of the first through fourth data lines DL1-DL4 that corresponds to a bit cell 110 that is not one of the target bit cells, and the voltages for the writing/reading operation could be applied to each one of the first through fourth data lines DL1-DL4 that corresponds to one of the target bit cells 110.

[Example Search Operations—TCAM]

The control circuitry 150 may control the TCAM 100 to perform a search operation across the entire array 140 simultaneously. In particular, when the control signal Ctrl instructs the control circuitry 150 that a search operation is to be performed, the row driver 151 may select all of the word storage blocks simultaneously by applying $V_{DD}$ to all of the word lines WL, and may pre-charge all of the match lines ML. The column driver 152 may then proceed to apply voltages to the column lines to perform the search operation, with bit cells 110 that are in the same column as one another being searched based on a same search criterion as one another. The search criterion for each column may be determined by the column driver 152 based on the input search word and bit positions that correspond to the columns (e.g., each bit cell 110 in the bit-k position column is searched based on the criterion corresponding to the $k^{th}$ bit of the input search word, for k={0, 1, . . . N−1}). For each column of the array 140, voltages may be applied to the first through fourth data lines DL1-DL4 that correspond to the respective column based on the search criterion for the respective column in the manner that was described above with respect to searching a single bit cell 110 (see also FIGS. 5A and 5B). The row driver 151 may then monitor the match lines ML to determine which are pulled low (indicating that the corresponding word storage block stores a word that is a miss) and which match lines ML remain charged (indicating that the corresponding word storage block stores a word that is a match). The row driver 151 may output an address of any word storage block that is a match.

Figure 7:
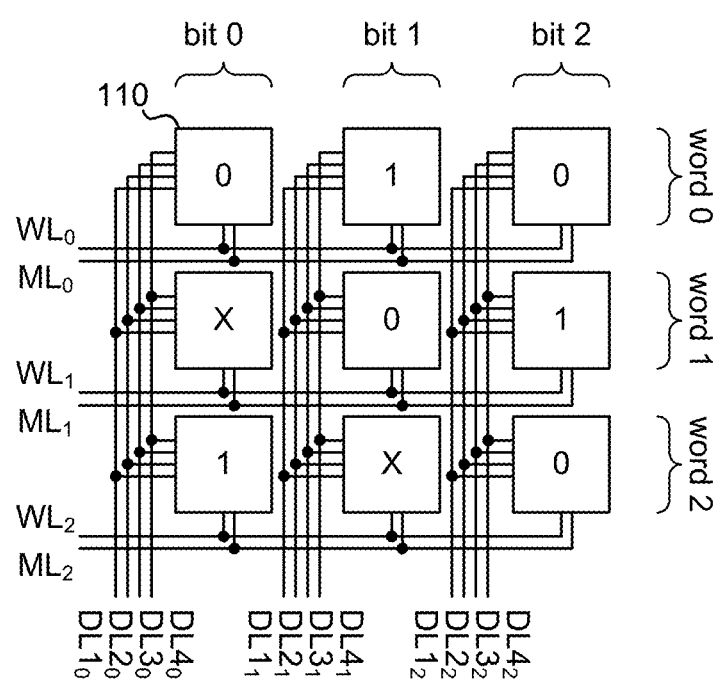
FIG. 7 is a diagram illustrating an example TCAM with an array of bit cells storing particular values.

For example, consider the example TCAM 100 illustrated in FIG. 7, which includes an array 140 having three rows and three columns of bit cells 110, with the bit cells 110 each storing values as indicated in the figure. Suppose that this example TCAM 100 is searched with the input search word being "Y10". The column driver 152 will receive the input search word and the control signal Ctrl indicating a search operation, and based thereon would determine that the bit-0 column should be searched based on the wildcard search criterion (since the $0^{th}$ bit of the search word is Y), the bit-1 column should be searched based on the 1 search criterion (since the $1^{st}$ bit of the search word is 1), and the bit-2 column should be searched based on the 0 search criterion (since the $2^{nd}$ bit of the search word is 0). Accordingly, the column driver 152 may perform the search operation by, for example, applying voltages to the various wiring lines as follows:

| bit-0 column (Y search criterion) | | | bit-1 column (1 search criterion) | | | | bit-2 column (0 search criterion) | | | | |
|---|---|---|---|---|---|---|---|---|---|---|---|
| $DL1_0$ | $DL2_0$ | $DL3_0$ | $DL4_0$ | $DL1_1$ | $DL2_1$ | $DL3_1$ | $DL4_1$ | $DL1_2$ | $DL2_2$ | $DL3_2$ | $DL4_2$ |
| — | — | GND | GND | GND | $V_{search}$ | $V_{search}$ | GND | $V_{search}$ | GND | $V_{search}$ | GND |

Since the bit-0 column is searched on the basis of the Y-criterion (wild card), none of the bit cells 110 in this column will be a miss regardless of what values are stored therein. Hence none of the bit cells 110 in the bit-0 column will pull down their respective match lines ML. In particular, the voltage of the node $G_2$ in each bit cell 110 in the bit-0 column will be GND because GND is applied to $DL3_0$ and $DL4_0$. Because $V_0$ is applied to the rail RL, the gate-source voltage of the second match-line transistor $T_4$ of each bit cell 110 in the bit-0 column will be $(-)V_0$, and hence the second match-line transistor $T_4$ of each bit cell 110 in the bit-0 column will remain off.

The [bit-1, word-0] bit cell 110 is searched on the basis of the 1 search criterion and stores a 1, and hence the voltage of node $G_1$ becomes $$\frac{R_{LRS}}{R_{LRS}+R_{T1}}V_{search}$$

(see equation 12), which is a low value. Thus, the first match-line transistor $T_3$ remains off. The voltage of the node $G_2$ becomes $$\frac{R_{T2}}{R_{LRS}+R_{T2}}V_{search}$$

(see equation 8), which is a high value, and therefor the second match-line transistor $T_4$ is turned on. Because the first match-line transistor $T_3$ remains off, the match line $ML_0$ is not connected to the rail RL by the [bit-1, word-0] bit cell 110.

The [bit-2, word-0] bit cell 110 is searched on the basis of the 0 search criterion and stores a 0, and hence the voltage of node $G_1$ becomes $$\frac{R_{T1}}{R_{HRS}+R_{T1}}V_{search}$$

(see equation 9), which is a low value. Thus, the first match-line transistor $T_3$ remains off. The voltage of the node $G_2$ becomes $$\frac{R_{T2}}{R_{LRS}+R_{T2}}V_{search}$$

(see equation 8), which is a high value, and therefor the second match-line transistor $T_4$ is turned on. Because the first match-line transistor $T_3$ remains off, the match line $ML_0$ is not connected to the rail RL by the [bit-2, word-0] bit cell 110.

Because none of the bit cells 110 in the word 0 pull down the match line $ML_0$, the row driver 151 determines that the word 0 is a match for the search word. Thus, an address of the word 0 is output from the row driver 151 as an output address.

The [bit-1, word-1] bit cell 110 is searched on the basis of the 1 search criterion and stores a 0, and hence the voltage of node $G_1$ becomes $$\frac{R_{HRS}}{R_{HRS}+R_{T1}}V_{search}$$

(see equation 11), which is a high value. Thus, the first match-line transistor $T_3$ is turned on. The voltage of the node $G_2$ becomes $$\frac{R_{T2}}{R_{LRS}+R_{T2}}V_{search}$$

(see equation 8), which is a high value, and therefor the second match-line transistor $T_4$ is turned on. Because both of the first and second match-line transistors $T_3$ and $T_4$ are turned on, the match line $ML_1$ is connected to the rail RL by the [bit-1, word-1] bit cell 110 and the voltage of the match line $ML_1$ is pulled down.

The [bit-2, word-1] bit cell 110 is searched on the basis of the 0 search criterion and stores a 1, and hence the voltage of the node $G_1$ becomes $$\frac{R_{T1}}{R_{LRS}+R_{T1}}V_{search}$$

(see equation 10), which is a high value. Thus, the first match-line transistor $T_3$ is turned on. The voltage of the node $G_2$ becomes $$\frac{R_{T2}}{R_{LRS}+R_{T2}}V_{search}$$

(see equation 8), which is a high value, and therefor the second match-line transistor $T_4$ is turned on. Because both of the first and second match-line transistors $T_3$ and $T_4$ are turned on, the match line $ML_1$ is connected to the rail RL by the [bit-2, word-1] bit cell 110 and the voltage of the match line $ML_1$ is pulled down.

Because the [bit-1, word-1] bit cell 110 and the [bit-2, word-1] bit cell 110 both pull down the match line $ML_1$, the row driver 151 determines that the word 1 is a miss for the search word. Thus, an address of the word 1 is not output from the row driver 151 as an output address.

The [bit-1, word-2] bit cell 110 is searched on the basis of the 1 search criterion and stores an X, and hence the voltage of node $G_2$ becomes $$\frac{R_{T2}}{R_{HRS}+R_{T2}}V_{search}$$

(see equation 7), which is a low value. Thus, the second match-line transistor $T_4$ is kept off. Because the second match-line transistor $T_4$ remains off, the match line $ML_2$ is not connected to the rail RL by the [bit-1, word-2] bit cell 110. (Note that this same result would have occurred if the bit cell 110 had been searched on the basis of the 0 search criterion).

The state of the [bit-2, word-2] bit cell 110 is similar to the state of the [bit-2, word-0] bit cell 110 that was described above, and hence the [bit-2, word-2] bit cell 110 does not pull down the match line $ML_2$.

Because none of the bit cells 110 in the word 2 pull down the match line $ML_2$, the row driver 151 determines that the word 2 is a match for the search word. Thus, an address of the word 2 is output from the row driver 151 as an output address.

Thus, in this example, in response to receiving "Y10" as an input search word and a control signal Ctrl indicating that a search is to be performed, the example TCAM 100 outputs the addresses of the word 0 and the word 2, both of which store words that match the input search word.

[Example Devices with TCAMs]

The example TCAMs described herein may be used in any electronic device in which a memory might be useful, such as, for example, in a personal computer, server, smartphone, tablet, network device, etc. In particular, the example TCAMs can be used to store data for the device by writing the data into the TCAM, and the device can access the stored data by reading from the TCAM. Moreover, the example TCAMs may also allow the device to search the TCAM based on an input search word, which can be particularly useful in a variety of applications. For example, a database application executed by an example device may benefit greatly by the device using the example TCAMs. As another example, a network device (such as a router, switch, gateway, etc.) may greatly benefit from using the example TCAMs, as the high search speed provided by the TCAM may allow the network device to operate at higher speeds than may otherwise be possible.

Figure 8:
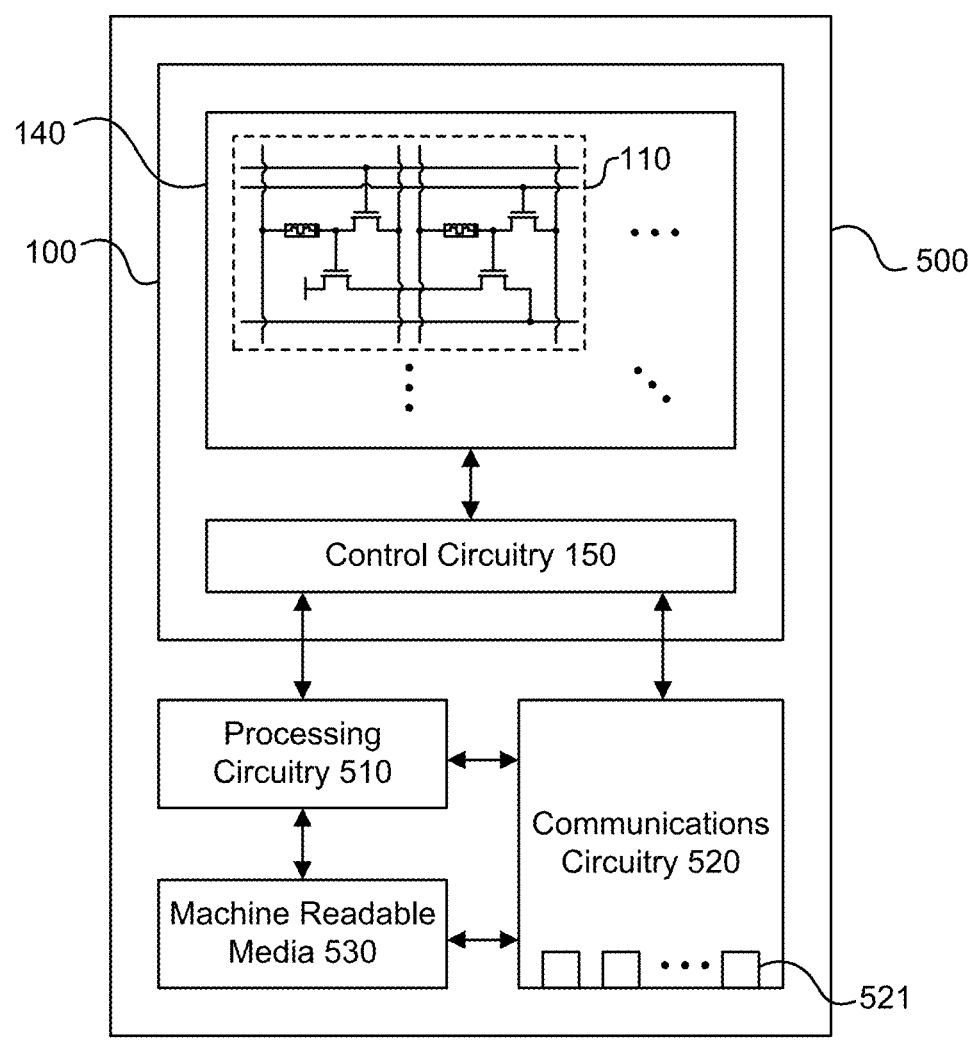
FIG. 8 is a diagram illustrating an example device that includes an example CAM as a component thereof.

FIG. 8 illustrates an example device 500 that includes an example TCAM 100. For ease of explanation, certain aspects of the example device 500 will be described below with the assumption that the example device 500 operates as a network device, but it should be understood that the example device 500 could be any type of electronic device. Moreover, some of the features described below could be omitted from the example device 500 and others not described below could be added.

The device 500 may include a TCAM 100, processing circuitry 510, communications circuitry 520, and machine readable media 530. The TCAM 100 may be an instance of the example TCAM 100 described above, and may include an array 140 of bit cells 110 and control circuitry 150.

The processing circuitry 510 may supply the control signal Ctrl to the control circuitry 150. The processing circuitry 510 may also supply the input word and the read/write address to the control circuitry 150. The processing circuitry 510 may be any circuitry capable of executing machine-readable instructions, such as a central processing unit (CPU), a microprocessor, a microcontroller device, a digital signal processor (DSP), etc. The processing circuitry 510 may also be an application-specific integrated circuit (ASIC), a field-programmable gate array (FPGA), an application-specific instruction set processor (ASIP), or the like, that is configured to perform certain operations described herein, such as the read, write, and search operations.

The machine readable media 530 may be any non-transitory machine readable medium, which may include volatile storage media (e.g., DRAM, SRAM, etc.) and/or non-volatile storage media (e.g., PROM, EPROM, EEPROM, NVRAM, hard drives, optical disks, etc.). The machine readable media 530 may store machine-readable instructions that, when executed by the processing circuitry 510, cause the device 500 to perform some or all of the operations described herein, such as the read, write, and search operations.

The communications circuitry 520 may be circuitry for receiving input data communications and sending output data communications. For example, the communications circuitry 520 may include a network interface card. In certain examples, the communications circuitry 520 may include multiple communications ports 521, and may serve to connect multiple other electronic devices to one another via the device 500. For example, the device 500 may be a network router, network switch, network gateway, or the like, and may perform various traffic control tasks such as routing, switching, etc. In certain examples, the communications circuitry 520 may receive communications that include a destination address (such as an IP address), and the communications circuitry 520 may determine which communications port 521 to forward the received communication to based on the destination address.

In particular, the communications circuitry 520 may determine which port 521 to forward a received communication to by searching the TCAM 100 based on the destination address that was included in the communication. For example, each device that is connected to the device 500 may have a unique device address (such as an IP address), and the device 500 may store the device address of each device that is connected thereto in the TCAM 100 such that the location of the stored device address within the TCAM 100 corresponds to the communications port 521 to which the device is connected. In particular, each word storage block of the TCAM 100 may correspond to a different port 521 of the device 500, and whenever a new device is connected to the device 500 the device address of the new device may be written into a word storage block that corresponds to the port 521 to which the new device is connected. Subsequently, when a communication is received by the communication circuitry 520, the destination address of the communication may be sent to the TCAM 100 (either directly, or via the processing circuitry 510) as an input search word; the TCAM 100 may then return a memory address of a matching word storage block to the communications circuitry 520 (either directly or via the processing circuitry 510). Because each word storage block in this example corresponds to a particular port 521, the memory address of the word storage block may be understood by the communications circuitry 520 to identity a particular port 521, and therefore the communications circuitry 520 can determine which port 521 to forward the communication to based on the output address of the TCAM 100. In certain examples, the memory address of each word storage block may be the same as the address of one of the ports 521, which may enable the communications circuitry 520 to easily determine from an output memory address which port 521 corresponds thereto.

In such an example, the TCAM 100 may operate as a look-up table that indicates which port corresponds to which destination address. However, because the entire array 140 of the TCAM 100 may be searched simultaneously and may be searched at the hardware level, the amount of time it takes for the device 500 to determine which port to forward a communication to can be greatly reduced.

In certain examples described above, the example memristors $M_1$ and $M_2$ are bipolar memristors—i.e., each is set by a voltage difference/current having one polarity and reset by a voltage difference/current having a different polarity. However, in other examples the memristors $M_1$ and $M_2$ may each be a unipolar memristor—i.e., a memristor that is set and reset by the same polarity. In examples that use unipolar memristors, the same reading and searching operations that were described above with regard to a bipolar memristor could be used, and any known unipolar memristor writing method could be used in place of the writing method described above.

In the description above, the memory elements of the bit cell 110 are described as memristors. In the art, the term "memristor" may be used in certain contexts in a broad sense and may be used in certain contexts in a narrow sense. In a narrow sense, "memristor" may refer specifically to circuit elements that exhibit a non-linear relationship between electric charge and magnetic flux (or exhibit a relationship between the time integral of current and the time integral of voltage). In a broad sense, "memristor" refers broadly to any non-volatile memory element that is based on changing resistance states and is read by its resistance. Herein and in the appended claims, "memristor" is always used in the broad sense, unless specifically indicated otherwise; specifically, as used herein, "memristor" refers broadly to any non-volatile memory element that is based on changing resistance states and is read by its resistance. Thus, the memristors $M_1$ and $M_2$ may each be, for example, a memristor in the narrow sense of the term, a memory element that changes the resistance across a dielectric solid-state material, a resistive random-access memory element (sometimes referred to as RRAM or ReRAM), a phase-change memory element (sometimes referred to as PCM or PCRAM), a conductive-bridging memory element (sometimes referred to as CBRAM or a programmable metallization cell), a magnetoresistive memory element (sometimes referred to as MRAM), or the like.

The example TCAMs are described herein and illustrated in the drawings in a conceptual or schematic manner to aid understanding. In particular, physical structures in the example TCAMs are referred to and/or illustrated conceptually herein as circuit components, and the relationships between these circuit components are illustrated in circuit diagrams in accordance with the usual practice in the art. Circuit components are conceptual representations of classes of physical structures or devices that perform certain functions and/or have certain properties. Examples of such circuit components include passive devices such as resistors, capacitors, memristors, etc.; active devices such as transistors, diodes, etc.; constituent elements of the active/passive devices such as terminals, electrodes, gates, sources, drains, etc.; elements that connect devices such as wiring lines, nodes, etc.; and so on. It should be understood that a single physical structure (or set of physical structures) in an actual physical incarnation of an example TCAM may serve multiple functions and/or have multiple properties, and thus a single physical structure (or set of physical structures) may be described and/or illustrated herein as multiple distinct circuit components. For example, a single piece of metal in a particular physical incarnation of an example TCAM may serve as both a gate electrode of a transistor and as a wiring line. Thus, the fact that two or more circuit components may be referred to or illustrated herein as distinct components should not be interpreted to mean that their corresponding physical structures in a physical incarnation of the example TCAM are distinct structures.

When reference is made herein or in the appended claims to a first circuit component being "connected to" a second circuit component, this means that: (1) the physical structures corresponding to the first and second components are so arranged that a current path exists therebetween, and/or (2) a single physical structure that is electrically conductive serves as at least a part of both the first and second circuit components. Note that, in light of this definition, a reference herein to or illustration in the drawings of multiple circuit components being "connected to" one another does not imply that the circuit components are necessarily separate physical entities. For example, a reference to a first circuit component being "connected to" a second circuit component could encompass: (A) a scenario in which a physical structure that serves as a terminal of the first circuit component is in direct physical contact with a physical structure that serves as a terminal of the second circuit; (B) a scenario in which a physical structure that serves as a terminal of the first circuit component is in direct physical contact with an electrical conductor (e.g., a wiring line) that is itself in direct physical contact with a physical structure that serves as a terminal of the second circuit; (C) a scenario in which the same physical structure that serves as a terminal of the first circuit component also serves as a terminal of the second circuit component; etc.

When reference is made herein or in the appended claims to a first component being "connected between" second and third component, this means that two opposing terminals of the first component are connected to the second component and to the third component, respectively. In particular, when reference is made herein or in the appended claims to a transistor being "connected between" two elements, this means that a source terminal of the transistor (also referred to as a source electrode, source region, source, etc.) is connected to one of the two elements, and a drain terminal of the transistor (also referred to as a drain electrode, drain region, drain, etc.) is connected to the other one of the two elements.

When reference is made herein or in the appended claims to a number of circuit components being "connected in series between" a first element and a second element, this means that the number of circuit components are connected end-to-end in a series, in the same order that they are recited, and that the first circuit component of the series is connected to the first element and the last circuit component of the series is connected to the second element. For example, "A, B, and C are connected in series between D and E" means that D is connected to A, A is connected to B, B is connected to C, and C is connected to E, which may be graphically represented as D-{A-B-C}-E where the dashes ("-") indicate connections and the braces ("{ }") indicate the series.

When reference is made herein or in the appended claims to a first circuit component being "switchably connected to" a second circuit component, this means that a switch is interposed between the first and second circuit components such that the first circuit component is "connected to" the second component when the switch is closed and is not "connected to" the second component when the switch is open. In this context, a switch is any device that can selectively connect or disconnect the first and second circuit elements to/from each other. For example, the switch may be a transistor, a multiplexor, a demultiplexer, a mechanical switch, etc. When a transistor is the switch, the switch is closed when the transistor is on (i.e., ohmic, i.e., a channel has formed), and the switch is open when the transistor is off (i.e., not ohmic, i.e., no channel has formed).

As used herein, applying a given voltage difference "across" a circuit component (such as the memristor M) means applying voltages to two terminals of the circuit component such that the larger of the applied voltages minus the smaller of the applied voltages equals the given voltage difference. A polarity with which the voltage difference is applied across the circuit component corresponds to the direction in which current would tend to flow through the circuit component (if allowed to do so) as a result of the applied voltage difference, which will depend upon which terminal of the circuit component has the larger of the applied voltages. In particular, when the given voltage difference is applied across the circuit component by applying the larger of the applied voltages to a first terminal of the circuit component and the smaller of the applied voltages to a second terminal of the circuit component, this may be referred to as applying the given voltage difference with a first polarity; when the given voltage difference is applied across the circuit component by applying the larger of the applied voltages to the second terminal and the smaller of the applied voltages to a first terminal, this may be referred to as applying the given voltage difference with a second polarity.

References herein to a resistance $R_{LRS}$ that is associated with a low resistance state of the memristor $M_1$ or $M_2$ should not be interpreted to imply that each memristor $M_1$ or $M_2$ is set precisely to the value $R_{LRS}$ each time they are set to the low resistance state. In certain examples, the low resistance state of the memristor $M_1$ or $M_2$ might encompass a range of resistance values rather than just one specific resistance value. In particular, the resistance of the memristor $M_1$ or $M_2$ is not necessarily the exact same value each time that the memristor $M_1$ or $M_2$ is set to the low resistance state. This may occur, for example, as a result of inevitable manufacturing variances between memristors $M_1$ or $M_2$ as well as inventible variances in the voltages that are applied for setting/resetting operations. Instead, the resistance $R_{LRS}$ is a particular resistance value that is associated with the range of resistance values that comprises the low resistance state of the memristor $M_1$ or $M_2$.

Similarly, references herein to a resistance $R_{HRS}$ that is associated with a high resistance state of the memristor $M_1$ or $M_2$ should not be interpreted to imply that each memristor $M_1$ or $M_2$ is set precisely to the value $R_{HRS}$ each time they are reset to the high resistance state. In certain examples, the high resistance state of the memristor M might encompass a range of resistance values rather than just one specific resistance value. In particular, the resistance of the memristor $M_1$ or $M_2$ is not necessarily the exact same value each time that the memristor $M_1$ or $M_2$ is reset to the high resistance state. Instead, the resistance $R_{HRS}$ is a particular resistance value that is associated with the range of resistance values that comprises the high resistance state of the memristor $M_1$ or $M_2$.

The resistances $R_{LRS}$ and $R_{HRS}$ may be determined by a variety of methods. For example, the memristor $M_1$ or $M_2$ may be repeatedly set and reset and the resistance thereof measured, a range of resistance values for the low resistance state and a range of resistance values for the high resistance state may be determined from the measured values of resistances, and the resistances $R_{LRS}$ and $R_{HRS}$ may be determined to be particular values within their corresponding ranges. For example, the resistance $R_{LRS}$ may be the highest value of the range of low resistance state values and the resistance $R_{HRS}$ may be the lowest value of the range of high resistance state values. In certain examples, the resistances $R_{LRS}$ and $R_{HRS}$ may be determined to be statistical aggregations of the measured resistance values of the memristor $M_1$ or $M_2$ (or of multiple memristors $M_1$ or $M_2$) in the set and reset states, respectively; for example, $R_{LRS}$ and $R_{HRS}$ may be determined to be the average, the median, the mode, etc., of their respectively corresponding measured resistance values. In certain examples, the memristor(s) $M_1$ or $M_2$ may be repeatedly set and reset and their resistances measured, and $R_{LRS}$ and $R_{HRS}$ may be determined to be the lowest and the highest resistance values, respectively, that are measured in this process.

For simplicity, the description above refers to a single $R_{LRS}$ value and a single $R_{HRS}$ value for both the first and second memristors $M_1$ and $M_2$. However, the first and second memristors $M_1$ and $M_2$ do not necessarily have to be identical, and the low resistance state or high resistance state of the first memristor $M_1$ is not necessarily identical to the low resistance state or high resistance state of the second memristor $M_2$. Thus, the memristor $M_1$ may have a resistance associated with its low resistance state ($R_{LRS\_1}$) that is different from a resistance that is associated with the low resistance state of the second memristor $M_2$ ($R_{LRS\_2}$). In such examples, the descriptions above that refer to $R_{LRS}$ may be understood to refer to $R_{LRS\_1}$ if they pertain to the first memristor $M_1$ (e.g., equations 9-12, the first four inequalities of equation 13, the second inequality of equation 14) and to $R_{LRS\_2}$ if they pertain to the second memristor $M_2$ (e.g., equation 8, the last two inequalities of equation 13, and the fourth inequality of equation 14). Similarly, the memristor $M_1$ may have a resistance associated with its high resistance state ($R_{HRS\_1}$) that is different from a resistance that is associated with the high resistance state of the second memristor $M_2$ ($R_{HRS\_2}$). In such examples, the descriptions above that refer to $R_{HRS}$ may be understood to refer to $R_{HRS\_1}$ if they pertain to the first memristor $M_1$ (e.g., equations 9-12, the first four inequalities of equation 13, the first inequality of equation 14) and to $R_{HRS\_2}$ if they pertain to the second memristor $M_2$ (e.g., equation 7, the last two inequalities of equation 13, and the third inequality of equation 14).

In the description above, the transistors of the bit cell were described as all being NFET transistors, but it should be understood that all PFET transistors could be used instead. In such a case, the voltages that result in the transistors turning on and off would be reversed (low gate-source voltage turning the PFET on and high gate-source voltage turning the PFET off), and therefore voltages applied during the search operations may be reversed to preserve the desired search results.

When describing the arrangements of circuit components and locations where voltages are applied to circuit components, references may be made to directions (e.g., "left", "right", etc.). These references should be understood to refer to directions in the circuit diagrams illustrated in the Figures. These references do not imply any sort of limitation with regard to the physical location of structures in a physical incarnation of an example TCAM. Moreover, references may be made to a "side" of a circuit component (e.g, "left side", "right side", etc.). These references should be understood to refer the terminal of the circuit component that corresponds to the identified side of the symbol that represents the circuit component in the circuit diagrams. These references do not imply any sort of limitation with regard to the orientation or location of structures corresponding to the circuit component in a physical incarnation of an example TCAM. Thus, for example, a reference to a voltage being applied to the "left side" of the memristor $M_1$ means that the voltage is applied to the terminal of the memristor $M_1$ that is connected to the first data line DL1, because in FIG. 1 the left side of the symbol that represents the memristor $M_1$ corresponds to the terminal that is connected to the first data line DL1.

Throughout this disclosure and in the appended claims, occasionally reference may be made to "a number" of items. Such references to "a number" mean any integer greater than or equal to one. When "a number" is used in this way, the word describing the item(s) may be written with the pluralized "s" for grammatical consistency, but this does not necessarily mean that multiple items are being referred to. Thus, for example, "a number of comparators" could encompass both one comparator and multiple comparators.

While the above disclosure has been shown and described with reference to the foregoing examples, it should be understood that other forms, details, and implementations may be made without departing from the spirit and scope of this disclosure.

What is claimed is:

1. A ternary content addressable memory, comprising:
  a bit cell that includes:
    a first memristor that has a first terminal that is connected to a first data line and a second terminal that is connected to a first switching transistor that is to selectively connect the first memristor to a second data line;
    a second memristor that has a first terminal that is connected to a third data line and a second terminal that is connected to a second switching transistor that is to selectively connect the second memristor to a fourth data line;

a first match-line transistor and a second match-line transistor that are connected in series between a first rail and a match line, wherein a gate of the first match-line transistor is connected to the second terminal of the first memristor, and a gate of the second match-line transistor is connected to the second terminal of the second memristor, wherein the first switching transistor is sized such that its channel resistance when on is between a resistance associated with a low resistance state of the first memristor and a resistance associated with a high resistance state of the first memristor, and the second switching transistor is sized such that its channel resistance when on is between a resistance associated with a low resistance state of the second memristor and a resistance associated with a high resistance state of the second memristor.

2. The ternary content addressable memory of claim 1, further comprising:

control circuitry to write to the bit cell, read from the bit cell, and search the bit cell, wherein the control circuitry is to search the bit cell for a first binary value by applying a first voltage to the first data line and to the third data line, and applying a ground voltage to the second data line and to the fourth data line, and the control circuitry is to search the bit cell for a second binary value by applying the ground voltage to the first data line and to the fourth data line, and applying the first voltage to the second data line and to the third data line.

3. The ternary content addressable memory of claim 2, wherein the control circuitry is to search the bit cell based on a wildcard search criterion by applying the ground voltage to the third data line and the fourth data line and/or by applying the ground voltage to the first data line and the second data line.

4. The ternary content addressable memory of claim 1, further comprising:

control circuitry to write to the bit cell, read from the bit cell, and search the bit cell, wherein the control circuitry is to write a first binary value to the bit cell by causing the first memristor to enter a high resistance state and the second memristor to enter a low resistance state, the control circuitry is to write a second binary value to the bit cell by causing the first memristor and the second memristor to both enter the low resistance state, and the control circuitry is to write a wildcard value to the bit cell by causing the second memristor to enter a high resistance state.

5. The ternary content addressable memory of claim 1, wherein the bit cell is to be searched based on a first search criterion, a second search criterion, and a wildcard search criterion, during a search, when a value stored in the bit cell misses a search criterion of the search, a voltage of the second terminal of the first memristor causes the first match-line transistor to turn on and a voltage of the second terminal of the second memristor causes the second match-line transistor to turn on, and during a search, when a value stored in the bit cell matches a search criterion of the search, a voltage of the second terminal of the first memristor causes the first match-line transistor to turn off and/or a voltage of the second terminal of the second memristor causes the second match-line transistor to turn off.

6. The ternary content addressable memory of claim 1, wherein the first and second switching transistors and the first and second match-line transistors are all a same channel type as one another.

7. The ternary content addressable memory of claim 1, wherein the bit cell includes no more than four transistors.

8. A ternary content addressable memory comprising:

a bit cell that includes a first resistive divider that includes a first memristor and a first switching transistor, which are connected to one another, as the resistive components thereof, a second resistive divider that includes a second memristor and a second switching transistor, which are connected to one another, as the resistive components thereof, and a first match-line transistor and a second match-line transistor that are connected in series between a first rail and a match line, wherein a voltage of an output terminal of the first resistive divider controls a conductive state of the first match-line transistor, and a voltage of an output terminal of the second resistive divider controls a conductive state of the second match-line transistor, wherein, a resistance state of the second memristor determines whether a wildcard value is stored in the bit cell regardless of a resistance state of the first memristor, and when a wildcard value is not stored in the bit cell, a resistance state of the first memristor determines which one of a first binary value and a second binary value is stored in the bit cell.

9. The ternary content addressable memory of claim 8, wherein the first switching transistor is sized such that its channel resistance when on is between a resistance associated with a low resistance state of the first memristor and a resistance associated with a high resistance state of the first memristor, and the second switching transistor is sized such that its channel resistance when on is between a resistance associated with a low resistance state of the second memristor and a resistance associated with a high resistance state of the second memristor.

10. The ternary content addressable memory of claim 8, further comprising:

control circuitry to write to the bit cell, read from the bit cell, and search the bit cell, wherein the control circuitry is to search the bit cell for a first binary value by applying a ground voltage and a first voltage to input terminals of the first resistive divider with a first polarity and applying the ground voltage and the first voltage to input terminals of the second resistive divider with the first polarity, and the control circuitry is to search the bit cell for a second binary value by applying the ground voltage and the first voltage to the input terminals of the first resistive divider with a second polarity, and applying the ground voltage and the first voltage to the input terminals of the second resistive divider with the first polarity.

11. The ternary content addressable memory of claim 10, wherein the control circuitry is to search the bit cell based on a wildcard search criterion by applying a ground voltage to both of the input terminals of the second resistive divider and/or to both of the input terminals of the first resistive divider.

12. The ternary content addressable memory of claim 8, wherein the bit cell is to be searched based on a first search criterion, a second search criterion, and a wildcard search criterion, during a search, when a value stored in the bit cell misses a search criterion of the search, a voltage of an output terminal of the first resistive divider causes the first match-line transistor to turn on, and a voltage of an output terminal of the second resistive divider causes the second match-line transistor to turn on, and during a search, when a value stored in the bit cell matches a search criterion of the search, a voltage of an output terminal of the first resistive divider causes the first match-line transistor to turn off and/or a voltage of an output terminal of the second resistive divider causes the second match-line transistor to turn off.

13. The ternary content addressable memory of claim 8, wherein the bit cell includes no more than four transistors.

14. An electronic device comprising:

a ternary content addressable memory (TCAM) that comprises a plurality of bit cells; and control circuitry that is to store words in the TCAM and to search the TCAM for stored words;

wherein each of the plurality of bit cells includes:
 two match-line transistors that are connected in series between a match line and a rail; and
 two resistive dividers, where each of the resistive dividers includes a memristor and a switching transistor, which are connected to one another, as the resistive components thereof and an output voltage thereof controls one of the match-line transistors, the control circuitry is to store a first binary value, a second binary value, and a wildcard value in the TCAM, and the control circuitry is to search the plurality of bit cells on the basis of a first search criterion, on the basis of a second search criterion, and on the basis of a wildcard search criterion, wherein, for each of the plurality of bit cells:
 a resistance state of the memristor of a first one of the resistive dividers determines whether a wildcard value is stored in the bit cell regardless of a resistance state of the memristor of a second one of the resistive dividers, and
 when a wildcard value is not stored in the bit cell, a resistance state of memristor of the second one of the resistive dividers determines whether a first binary value or a second binary value is stored in the bit cell.

15. The electronic device of claim 14, wherein the TCAM comprises a plurality of match lines that each correspond to a word block that comprises a word-sized subset of the plurality of bit cells, for each of the plurality of bit cells, the match-line transistors of the respective bit cell are connected in series between the rail and one of the plurality of match lines, and the control circuitry is to search the TCAM for a given word by pre-charging the plurality of match lines, applying voltage differences across the respective resistive dividers of the plurality of bit cells based on the given word, and identifying as a match any word block whose corresponding match line does not have its voltage pulled down.

16. The electronic device of claim 14, wherein, for each of the resistive dividers of each of the plurality of bit cells, the switching transistor of the respective resistive divider is sized such that its channel resistance when on is between a resistance associated with a low resistance state of the memristor of the respective resistive divider and a resistance associated with a high resistance state of the memristor of the respective resistive divider.

17. The electronic device of claim 14, wherein the control circuitry is to search a given one of the plurality of bit cells on the basis of the first search criterion by applying a ground voltage and a first voltage to the terminals of each of the resistive dividers thereof with a first polarity, the control circuitry is to search the given one of the plurality of bit cells on the basis of the second search criterion by applying the ground voltage and the first voltage to the terminals of one of the resistive dividers thereof with a second polarity and applying the ground voltage and the first voltage to the terminals of the other one of the resistive dividers thereof with the first polarity, and the control circuitry is to search the bit cell based on a wildcard search criterion by applying a ground voltage to both of the input terminals of at least one of the resistive dividers.

* * * * *